(12) United States Patent
Tran et al.

(10) Patent No.: US 10,170,693 B2
(45) Date of Patent: Jan. 1, 2019

(54) MAGNETORESISTIVE DEVICE AND METHOD OF FORMING THE SAME

(71) Applicant: Agency for Science, Technology and Research, Singapore (SG)

(72) Inventors: Michael Tran, Singapore (SG); Anibal Gonzalez, Singapore (SG); Sze Ter Lim, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/546,499

(22) PCT Filed: Jan. 20, 2016

(86) PCT No.: PCT/SG2016/050021
§ 371 (c)(1),
(2) Date: Jul. 26, 2017

(87) PCT Pub. No.: WO2016/122402
PCT Pub. Date: Aug. 4, 2016

(65) Prior Publication Data
US 2018/0026178 A1   Jan. 25, 2018

(30) Foreign Application Priority Data

Jan. 27, 2015  (SG) .......................... 10201500628T

(51) Int. Cl.
*H01L 43/08*   (2006.01)
*H01L 43/12*   (2006.01)
(Continued)

(52) U.S. Cl.
CPC ............ *H01L 43/08* (2013.01); *G11C 11/161* (2013.01); *H01F 10/329* (2013.01);
(Continued)

(58) Field of Classification Search
CPC ............ H01F 10/3272; H01F 10/3286; H01F 10/329; H01F 41/302; H01L 43/08; H01L 43/12; G11C 11/161
See application file for complete search history.

(56) References Cited

U.S. PATENT DOCUMENTS

2001/0026470 A1   10/2001   Gillies et al.
2007/0063236 A1   3/2007    Huai et al.
(Continued)

OTHER PUBLICATIONS

International Preliminary Report on Patentability for International Application No. PCT/SG2016/050021 dated Oct. 5, 2016, pp. 1-18.
(Continued)

*Primary Examiner* — Yosef Gebreyesus
(74) *Attorney, Agent, or Firm* — Winstead, P.C.

(57) ABSTRACT

According to embodiments of the present invention, a magnetoresistive device is provided. The magnetoresistive device includes a free magnetic layer structure having a variable magnetization orientation, a fixed magnetic layer structure having a fixed magnetization orientation, and a tilting magnetic layer structure configured to provide an interlayer exchange biasing field to tilt, at equilibrium, the fixed magnetization orientation or the variable magnetization orientation relative to the other to be along a tilting axis that is at least substantially non-parallel to at least one of a first easy axis of the fixed magnetization orientation or a second easy axis of the variable magnetization orientation. According to further embodiments of the present invention, a method of forming a magnetoresistive device is also provided.

20 Claims, 10 Drawing Sheets

(51) Int. Cl.
*G11C 11/16* (2006.01)
*H01F 10/32* (2006.01)
*H01F 41/30* (2006.01)

(52) U.S. Cl.
CPC ..... *H01F 10/3272* (2013.01); *H01F 10/3286* (2013.01); *H01F 41/302* (2013.01); *H01L 43/12* (2013.01)

(56) References Cited

U.S. PATENT DOCUMENTS

| | | |
|---|---|---|
| 2007/0195593 A1 | 8/2007 | Lee et al. |
| 2010/0046284 A1* | 2/2010 | Sugibayshi ............ B82Y 10/00 365/158 |
| 2012/0155153 A1 | 6/2012 | Shukh |
| 2012/0205760 A1* | 8/2012 | Zhou ................ H01L 29/66984 257/421 |
| 2013/0161770 A1 | 6/2013 | Meng et al. |
| 2014/0103470 A1* | 4/2014 | Shukh .................... H01L 29/82 257/421 |
| 2014/0252438 A1* | 9/2014 | Shukh ................ G11C 11/1675 257/295 |

OTHER PUBLICATIONS

Written Opinion of the International Searching Authority for International Application No. PCT/SG2016/050021 dated Mar. 7, 2016, pp. 1-5.

* cited by examiner

MAGNETORESISTIVE DEVICE AND METHOD OF FORMING THE SAME

CROSS-REFERENCE TO RELATED APPLICATION

This application claims the benefit of priority of Singapore patent application No. 10201500628T, filed 27 Jan. 2015, the content of it being hereby incorporated by reference in its entirety for all purposes.

TECHNICAL FIELD

Various embodiments relate to a magnetoresistive device and a method of forming a magnetoresistive device.

BACKGROUND

Spin Transfer Torque Magnetic Random Access Memory (STT-MRAM) is a non-volatile memory which is based on the storage of a binary information in the direction of the magnetization of a ferromagnetic layer with uniaxial magnetic anisotropy (free layer).

Historically, the magnetization of the free layer used to be defined within the plane of the layer, i.e., perpendicular to the growth direction. However, it has been shown that using a free layer with its magnetization aligned perpendicular to the plane leads to a reduced switching current needed to switch the magnetization, and hence, a lower power consumption for perpendicular STT-MRAM (pSTT-MRAM). STT-MRAM is already being mass-produced and pSTT-MRAM is currently being developed by most major memory companies.

One of the major issues with STT-MRAM and pSTT-MRAM is that controlling the switching at switching current pulses less than 10 ns is usually not possible. This mainly results from the fact that the magnetizations of the reference layer and the free layer are aligned (or anti-aligned) at equilibrium, and that the spin-transfer torque vanishes in such a geometry.

Therefore, an initial angle between the angles of the free and reference layers is needed, which is generally obtained thanks to thermal agitation. Thermal agitation, being a Brownian motion, is non deterministic, which in turn results in the switching pattern of (p)STT-MRAM being non-deterministic in the 1-10 ns switching current pulse range. While there exist solutions to overcome this issue and increase the magnetizations angle between the free and reference layers, none can be easily implemented in a (p)STT-MRAM.

SUMMARY

According to an embodiment, a magnetoresistive device is provided. The magnetoresistive device may include a free magnetic layer structure having a variable magnetization orientation, a fixed magnetic layer structure having a fixed magnetization orientation, and a tilting magnetic layer structure configured to provide an interlayer exchange biasing field to tilt, at equilibrium, the fixed magnetization orientation or the variable magnetization orientation relative to the other to be along a tilting axis that is at least substantially non-parallel to at least one of a first easy axis of the fixed magnetization orientation or a second easy axis of the variable magnetization orientation.

According to an embodiment, a method of forming a magnetoresistive device is provided. The method may include forming a free magnetic layer structure having a variable magnetization orientation, forming a fixed magnetic layer structure having a fixed magnetization orientation, and forming a tilting magnetic layer structure to provide an interlayer exchange biasing field to tilt, at equilibrium, the fixed magnetization orientation or the variable magnetization orientation relative to the other to be along a tilting axis that is at least substantially non-parallel to at least one of a first easy axis of the fixed magnetization or a second easy axis of the variable magnetization orientation.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Figure 1:
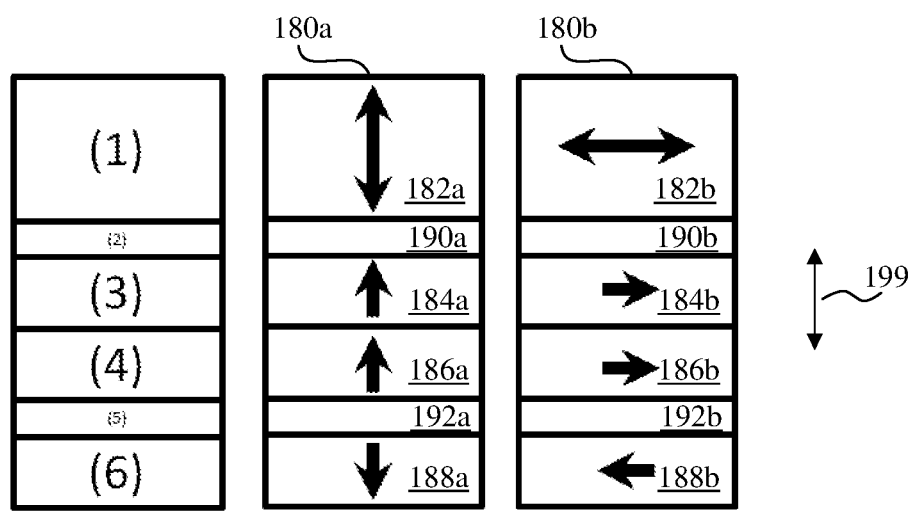
FIG. 1 shows schematic diagrams of a spin transfer torque magnetic random access memory (STT-MRAM) and a perpendicular spin transfer torque magnetic random access memory (pSTT-MRAM).

FIG. 1 shows schematic diagrams of a spin transfer torque magnetic random access memory (STT-MRAM) 180a and a perpendicular spin transfer torque magnetic random access memory (pSTT-MRAM) 180b, illustrating STT-MRAM and pSTT-MRAM including a synthetic antiferromagnetic pinning layer.

FIG. 1 illustrates magnetic tunnel junctions (MTJs), generally including a free layer (layer (1)) 182a, 182b, a non-magnetic spacer layer (layer (2)) 190a, 190b and a reference layer (layer (3)) 184a, 184b. The arrow shown within each layer represents the (effective) magnetization orientation (or magnetic moments, or effective magnetic moments) of the layer. As shown in FIG. 1, the MTJ can have the magnetization of its layers pointing either parallel (MTJ 180b) or perpendicular (MTJ 180a) to the growth direction (or thickness direction), defined vertically (represented by the double-headed arrow 199) in FIG. 1.

The reference layer 184a, 184b has a fixed magnetization direction, meaning that the magnetization orientation of the reference layer 184a, 184b may be orientated in one direction, for example, pointing in the upward direction for the reference layer 184a and pointing in the right direction for the reference layer 184b. However, it should be appreciated that the magnetization orientation of the reference layer 184a may instead point in the downward direction and/or the magnetization orientation of the reference layer 184b may point in the left direction. The reference layer 184a, 184b may include cobalt-iron-boron (CoFeB) material.

The free layer 182a, 182b has at least a uniaxial anisotropy which allows its magnetization direction to be aligned either parallel or antiparallel to the magnetization direction of the reference layer 184a, 184b. Where the magnetization orientations of the free layer 182a, 182b and the corresponding reference layer 184a, 184b point in the same direction, the magnetization orientations of the free layer 182a, 182b and the corresponding reference layer 184a, 184b are aligned parallel to each other. Where the magnetization orientations of the free layer 182a, 182b and the corresponding reference layer 184a, 184b point in opposite directions, the magnetization orientations of the free layer 182a, 182b and the corresponding reference layer 184a, 184b are aligned antiparallel to each other. The free layer 182a, 182b may include cobalt-iron-boron (CoFeB)-based material.

The reference layer 184a, 184b can be made more stable by using a pinning layer (layer (4)) 186a, 186b. The pinning layer 186a, 186b may be employed to pin or fix the magnetization orientation of the reference layer 184a, 184b. The magnetization orientation of each pinning layer 186a, 186b may be aligned parallel to the magnetization orientation of the corresponding reference layer 184a, 184b. For example, the magnetization orientation of the pinning layer 186a may point in the upward direction, as shown in FIG. 1, or may point in the downward direction, depending on the magnetization orientation of the reference layer 184a. The magnetization orientation of the pinning layer 186b may point in the right direction, as shown in FIG. 1, or may point in the left direction, depending on the magnetization orientation of the reference layer 184b. The pinning layer 186a, 186b may include cobalt-iron-boron (CoFeB) material.

A synthetic antiferromagnet is created by coupling antiferromagnetically the pinning layer 186a, 186b with a compensating magnetic layer (layer (6)) 188a, 188b through a non-magnetic spacer layer (layer (5)) 192a, 192b. The non-magnetic spacer layer 192a, 192b may include ruthenium (Ru). The compensating magnetic layer 188a, 188b may include a multilayer structure of alternating layers of cobalt (Co) and platinum (Pt).

The magnetization orientation of each compensating magnetic layer 188a, 188b may be aligned antiparallel to the magnetization orientation of the corresponding pinning layer 186a, 186b, so that the compensating magnetic layer 188a, 188b and the corresponding pinning layer 186a, 186b are antiferromagnetically coupled to each other. For example, the magnetization orientation of the compensating magnetic layer 188a may point in the downward direction, as shown in FIG. 1, or may point in the upward direction, depending on the magnetization orientation of the pinning layer 186a. The magnetization orientation of the compensating magnetic layer 188b may point in the left direction, as shown in FIG. 1, or may point in the right direction, depending on the magnetization orientation of the pinning layer 186b.

As the magnetization orientations of the respective layers (e.g., free layer 182a, reference layer 184a, pinning layer 186a, compensating magnetic layer 188a) of the MTJ 180a point in the upward direction or the downward direction, parallel to the axis defined by the thickness direction 199, the respective layers of the MTJ 180a have perpendicular anisotropy. In other words, the respective magnetization orientations of the respective layers of the MTJ 180a may be aligned perpendicular to the major surface or plane (e.g., interface between the reference layer 184a and the pinning layer 186a) of the corresponding layer.

As the magnetization orientations of the respective layers (e.g., free layer 182b, reference layer 184b, pinning layer 186b, compensating magnetic layer 188b) of the MTJ 180b point in the right direction or the left direction, perpendicular to the axis defined by the thickness direction 199, the respective layers of the MTJ 180b have in-plane anisotropy. In other words, the respective magnetization orientations of the respective layers of the MTJ 180b may be aligned parallel to the major surface or plane (e.g., interface between the reference layer 184b and the pinning layer 186b) of the corresponding layer.

Each of the non-magnetic spacer layer (layer (2)) 190a, 190b may include a non-conductive and non-magnetic material or an insulator material, for example including but not limited to magnesium oxide (MgO), alumina (AlO$_x$), and titanium oxide (TiO$_x$). In this way, MTJs 180a, 180b may be configured as a tunnel magnetoresistive (TMR) device.

The skilled person familiar with the art of magnetic tunnel junctions design will appreciate that only layer (1) (free layer 182a, 182b), layer (2) (non-magnetic spacer layer 190a, 190b) and layer (3) (reference layer 184a, 184b) are generally or essentially required to form an MTJ, and that additional layers described in the context of FIG. 1 are refinements which may, or may not be present depending on the electrical, magnetic, structural and geometrical properties of the aforementioned layer (1) (free layer 182a, 182b), layer (2) (non-magnetic spacer layer 190a, 190b) and layer (3) (reference layer 184a, 184b).

As mentioned above, while there exist solutions to address issues related to spin transfer torque magnetic random access memory (STT-MRAM) and perpendicular spin transfer torque magnetic random access memory (pSTT-MRAM) and increase the magnetizations angle between the free and reference layers, none can be easily implemented in a (p)STT-MRAM. As described herein, various embodiments may provide a scheme to fulfill this gap.

Various embodiments may provide a method for switching a ferromagnet.

Various embodiments may provide a tilted reference layer through exchange bias with a synthetic antiferromagnet (SAF) for perpendicular spin transfer torque magnetic random access memory (STT-MRAM).

Various embodiments may provide one or more of the following: (i) reducing the switching time, (ii) reducing the reliance on thermal agitation, and (iii) reducing the switching current. The above-mentioned feature(s) may be achieved by increasing the angle between the free and reference layers, for example, increasing the angle between the respective magnetization orientations of the free and reference layers. Accordingly, various embodiments may provide a scheme to increase this angle.

Various embodiments may provide an approach to the issue of tilting the reference layer angle (angle of the magnetization orientation of the reference layer), for example, by a few degrees. For a 1° tilt angle, the magnetoresistance (MR) may be ~99.9% of its maximum value, but there is a drastic reduction of the switching current, especially at shorter current pulses. Therefore, various embodiments may provide a dramatic reduction in the switching current as well as the switching time.

Various embodiments relate to a method for tilting the angle of at least one of the ferromagnetic layers forming an STT-MRAM. In doing so, it is expected that the switching behavior of the STT-MRAM becomes deterministic even in the precessional regime, e.g., during the initial nanoseconds after a current pulse is applied to the STT-MRAM in order to switch its free layer. Various embodiments may allow the STT-MRAM to be switched at a very short current pulse duration, e.g., less than about 10 ns. On top of this, since the efficiency of the spin-transfer torque goes monotonically from a minimum at 0° to a maximum for an angle close to 90° between the magnetizations (or magnetization orientations) of the free and reference layers, various embodiments may lead to a reduced switching current at constant current pulse duration and free layer properties.

In order to achieve such a property, various embodiments may use the interlayer exchange coupling (IEC) to couple the reference layer to another magnetic layer (e.g., a tilting layer) which magnetization (orientation) may be perpendicular to it. Through micromagnetics simulations to be described later below, a sizeable angle of approximately 5-10° between the magnetizations of the free and reference layers may be achieved in a pSTT-MRAM using realistic parameters at a diameter of about 40 nm.

The interlayer exchange coupling (IEC) may be achieved either by direct coupling between the reference layer and the tilting layer, or more preferably, by separating the reference layer and the tilting layer using a non-magnetic spacer layer which allows IEC (e.g., ruthenium (Ru), tantalum (Ta), etc.).

In order to reduce the influence of the tilting layer on the free layer (e.g., a demagnetizing field), a more complex structure such as a synthetic antiferromagnet and/or a real antiferromagnet (e.g., IrMn, PtMn) may be used in lieu of a simple ferromagnet as the tilting layer.

It should be appreciated that using the scheme described herein on the free layer may also be possible.

Various embodiments may provide a method to increase the relative angle between the (magnetization orientations of the) free and reference layers of an STT-MRAM at equilibrium, so as to allow a faster deterministic switching of the aforementioned free layer as well as to achieve a lower switching current density.

Various embodiments may include the addition of at least one magnetic layer (e.g., a tilting magnetic layer or a tilting magnetic layer structure) which may have its magnetization (orientation) at least substantially perpendicular to that of the reference/pinning layers and which is exchange-coupled to it, in order to change its easy axis direction.

Various embodiments may provide embodiments to tilt, for example, the magnetization orientation of the reference layer, using an exchange bias instead of a static field (or stray field). Static fields are very sensitive to process variations of device sizes (such as radius and/or thickness variations), and therefore, using the exchange coupling provides a more elegant or less sensitive solution to tilt the magnetization orientation of, for example, the reference layer. Furthermore, the demagnetising (static) field is non-local, thus at high enough stack densities, two or more devices will interact due to the demagnetising field, thereby reducing memory scalability. On the other hand, various embodiments may not suffer from this problem as the interlayer exchange field is a local effect, affecting only the magnetic layers in immediate contact or in close proximity. Therefore, various embodiments may offer a more controllable tilting of the magnetization orientation of, for example, the reference layer.

As compared to a conventional perpendicular STT-MRAM, various embodiments may provide a faster switching time $\tau_s$, and/or a lower switching current density $j_c$. Correspondingly, a much lower switching energy/bit ($\propto j_c \times \tau_s$) may be provided.

As compared to other schemes to increase the angle between the free and reference layers, various embodiments do not require the use of any external magnetic field, and/or do not make use of stray fields. Further, the magnetoresistive device can be actually manufactured.

It should be appreciated that while various embodiments may be described based on the structures illustrated in FIG. 1, various embodiments are not limited to the MTJs 180a, 180b described in the context of FIG. 1 and may be applicable to any MTJ so long as at least layer (1) (free layer) and layer (3) (reference layer 184a, 184b) are present in the structure, for example, layer (1) (free layer), layer (2) (non-magnetic spacer layer) and layer (3) (reference layer 184a, 184b) may be present in the structure.

Figure 2A:
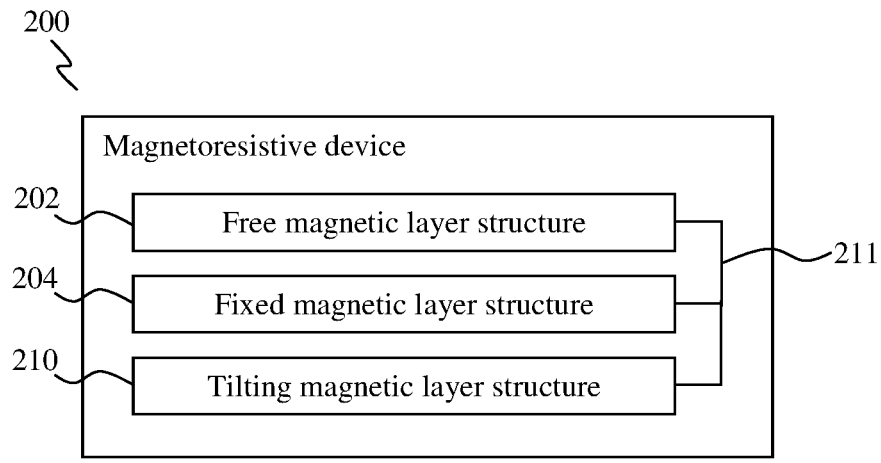
FIG. 2A shows a schematic view of a magnetoresistive device, according to various embodiments.

FIG. 2A shows a schematic view of a magnetoresistive device 200, according to various embodiments. The magnetoresistive device 200 includes a free magnetic layer structure 202 having a variable magnetization orientation, a fixed magnetic layer structure 204 having a fixed magnetization orientation, and a tilting magnetic layer structure 210 configured to provide an interlayer exchange biasing field to tilt, at equilibrium, the fixed magnetization orientation or the variable magnetization orientation relative to the other to be along a tilting axis that is at least substantially non-parallel to at least one of a first easy axis of the fixed magnetization orientation or a second easy axis of the variable magnetization orientation. In FIG. 2A, the line represented as 211 is illustrated to show the relationship between the fixed magnetic layer structure 204, the free magnetic layer structure 202 and the tilting magnetic layer structure 210, which may include magnetic coupling and/or mechanical coupling.

In other words, a magnetoresistive device 200 may be provided. The magnetoresistive device 200 may include a fixed magnetic layer structure 204, a free magnetic layer structure 202 and a tilting magnetic layer structure 210, which may be arranged one over the other (e.g., in a stack arrangement). The fixed magnetic layer structure 204 may have a magnetization orientation that is fixed in one direction along a first easy axis of the fixed magnetic layer structure 204. The free magnetic layer structure 202 may have a magnetization orientation that is variable between two directions or orientations along a second easy axis of the free magnetic layer structure 202. The tilting magnetic layer structure 210 may have a magnetization orientation that is fixed along an axis, for example, an easy axis of the tilting magnetic layer structure 210. The first easy axis and the second easy axis may be at least substantially parallel to each other.

The tilting magnetic layer structure 210 may be interlayer exchange coupled to a magnetic layer of the magnetoresistive device 200. The tilting magnetic layer structure 210 may provide an interlayer exchange biasing field (or interlayer exchange coupling field) that may tilt or rotate, at equilibrium, the fixed magnetization orientation or the variable magnetization orientation relative to the other to be along a tilting axis away from at least one of the first easy axis of the fixed magnetization orientation or the second easy axis of the variable magnetization orientation. The interlayer exchange biasing field is a local effect, affecting only the magnetic layers in close proximity or in immediate contact. This may offer a more controllable tilting of the magnetization orientation of the fixed magnetic layer structure 204 or the free magnetic layer structure 202.

As an example, the tilting magnetic layer structure 210 may be configured to provide an interlayer exchange biasing field to tilt or rotate the fixed magnetization orientation of the fixed magnetic layer structure 204 aligned initially along the first easy axis so as to be aligned along the tilting axis such that a relative (non-zero) angle may be provided between the tilting axis and each of the first easy axis and the second easy axis.

As a further example, the tilting magnetic layer structure 210 may be configured to provide an interlayer exchange biasing field to tilt or rotate the variable magnetization orientation of the free magnetic layer structure 202 aligned initially along the second easy axis so as to be aligned along the tilting axis such that a relative (non-zero) angle may be provided between the tilting axis and each of the first easy axis and the second easy axis.

Therefore, at equilibrium, as a result of the interlayer exchange biasing field provided by the tilting magnetic layer structure 210, the fixed magnetization orientation and the variable magnetization orientation may be aligned non-parallel or may be mis-aligned relative to each other. In this way, a relative (non-zero) angle may be provided between the fixed magnetization orientation and the variable magnetization orientation, at equilibrium. The interlayer exchange biasing field may change (e.g., increase) the relative angle between the fixed magnetization orientation and the variable magnetization orientation, at equilibrium. This may mean that, at equilibrium, an initial (non-zero) angle may be provided between the fixed magnetization orientation and the variable magnetization orientation, meaning that the respective magnetization orientations of the fixed magnetic layer structure 204 and the free magnetic layer structure 202 may not be aligned with one another at equilibrium.

As an example, at equilibrium, as a result of the interlayer exchange biasing field provided by the tilting magnetic layer structure 210, the fixed magnetization orientation and the variable magnetization orientation may be respectively aligned along corresponding axes that are non-parallel to each other, meaning that a relative (non-zero) angle may be provided between the corresponding axes, or that the corresponding axes are tilted, at a (non-zero) angle, relative to each other.

In various embodiments, the tilting magnetic layer structure 210 may include at least one tilting magnetic layer. For example, the tilting magnetic layer structure 210 may include a single tilting magnetic layer, or a pair of tilting magnetic layers antiferromagnetically coupled to each other.

In the context of various embodiments, the term "at equilibrium" may mean that the magnetoresistive device 200 is not in use, meaning that no electrical signal (e.g., current) is applied to the magnetoresistive device 200. The term "at equilibrium" may also mean that the variable magnetization orientation of the free magnetic layer structure 202 is in a non-transitory state. The term "non-transitory state" may mean a non-temporary state, a non-transient state, or a long-lived state. Accordingly a non-transitory state of the magnetization orientation may mean that the magnetization orientation may remain in the non-transitory state for a period of time, as compared to, for example, during the period when the magnetization orientation changes or switches, in a transitory state, in response to an electrical signal (e.g., during a writing process).

In the context of various embodiments, the term "easy axis" as applied to magnetism may mean an energetically favorable direction of spontaneous magnetization as a result of magnetic anisotropy. The magnetization orientation of a ferromagnetic layer may be aligned along the easy axis.

In the context of various embodiments, the term "fixed magnetic layer structure" may mean a magnetic layer structure having a fixed magnetization orientation. The fixed magnetic layer structure may include a hard ferromagnetic material. The hard ferromagnetic material may be resistant to magnetization and demagnetization (i.e., not easily magnetized and demagnetized), and may have a high hysteresis loss and a high coercivity. In the context of various embodiments, a fixed magnetic layer structure may be referred to as a "hard layer", a "hard magnetic layer" or a "ferromagnetic hard layer". In the context of various embodiments, the fixed magnetic layer structure may act as a reference layer.

In the context of various embodiments, the term "free magnetic layer structure" may mean a magnetic layer structure having a variable or switchable magnetization orientation. In other words, the magnetization orientation may be varied or switched, for example by applying a current. The magnetization orientation of the free magnetic layer structure may be varied, depending on the degree or amount of the magnetization reversal field (or current). The free magnetic layer structure may include a soft ferromagnetic material. The soft ferromagnetic material may be receptive to magnetization and demagnetization (i.e. easily magnetized and demagnetized), and may have a small hysteresis loss and a low coercivity, in comparison to the fixed magnetic layer structure. In the context of various embodiments, a free magnetic layer structure may be referred to as a "soft layer", a "soft magnetic layer" or a "ferromagnetic soft layer". In the context of various embodiments, the free magnetic layer structure may act as a free layer or a storage layer.

In various embodiments, the tilting magnetic layer structure 210 may have a (fixed) magnetization orientation along an axis (e.g., an easy axis) that may be at least substantially orthogonal (or perpendicular) to at least one of the first easy axis or the second easy axis. For example, the axis (e.g., an easy axis) of the magnetization orientation of the tilting magnetic layer structure 210 may be at least substantially orthogonal (90°) to the first easy axis of the fixed magnetic layer structure 204. This may mean that the tilting magnetic layer structure 210 may have magnetic anisotropy that may be at least substantially orthogonal to the magnetic anisotropy of the fixed magnetic layer structure 204 and the free magnetic layer structure 202.

In various embodiments, each of the fixed magnetic layer structure 204 and the free magnetic layer structure 202 may have perpendicular magnetic anisotropy. This may mean that the first easy axis of the fixed magnetic layer structure 204 and the second easy axis of the free magnetic layer structure 202 may be aligned parallel to the growth direction (or thickness direction) of the magnetoresistive device 200. As a non-limiting example, the magnetoresistive device 200 may be a perpendicular spin transfer torque magnetic random access memory (pSTT-MRAM).

In various embodiments, each of the fixed magnetic layer structure 204 and the free magnetic layer structure 202 may have in-plane magnetic anisotropy. This may mean that the first easy axis of the fixed magnetic layer structure 204 and the second easy axis of the free magnetic layer structure 202 may be aligned perpendicular to the growth direction (or thickness direction) of the magnetoresistive device 200. As a non-limiting example, the magnetoresistive device 200 may be a (in-plane) spin transfer torque magnetic random access memory (STT-MRAM).

In various embodiments, the magnetoresistive device 200 may further include a non-magnetic spacer layer between the fixed magnetic layer structure 204 and the free magnetic layer structure 202, for example, the non-magnetic spacer layer may be in contact with the fixed magnetic layer structure 204 and the free magnetic layer structure 202.

In various embodiments, the tilting magnetic layer structure 210 may be interlayer exchange coupled to the free magnetic layer structure 202 such that the interlayer exchange biasing field tilts, at equilibrium, the variable magnetization orientation of the free magnetic layer structure 202 to be along the tilting axis.

In various embodiments, the tilting magnetic layer structure 210 may be interlayer exchange coupled to the fixed magnetic layer structure 204 such that the interlayer exchange biasing field tilts, at equilibrium, the fixed magnetization orientation of the fixed magnetic layer structure 204 to be along the tilting axis.

The tilting magnetic layer structure 210 may be in contact with the fixed magnetic layer structure 204.

The magnetoresistive device 200 may further include a non-magnetic spacer layer (e.g., an interlayer exchange coupling layer) in between the tilting magnetic layer structure 210 and the fixed magnetic layer structure 204, the non-magnetic spacer layer including a material that enables interlayer exchange coupling between the tilting magnetic layer structure 210 and the fixed magnetic layer structure 204.

In various embodiments, the magnetoresistive device 200 may further include a pinning magnetic layer structure configured to pin the fixed magnetization orientation of the fixed magnetic layer structure 204, wherein the tilting magnetic layer structure 210 may be interlayer exchange coupled to the pinning magnetic layer structure such that the interlayer exchange biasing field tilts, at equilibrium, the fixed magnetization orientation of the fixed magnetic layer structure 204 to be along the tilting axis. The pinning magnetic layer structure may be arranged in between the fixed magnetic layer structure 204 and the tilting magnetic layer structure 210. The pinning magnetic layer structure may be arranged in contact with the fixed magnetic layer structure 204. The pinning magnetic layer structure may have magnetic anisotropy that is the same as the magnetic anisotropy of each of the fixed magnetic layer structure 204 and the free magnetic layer structure 202. The pinning magnetic layer structure may have magnetic anisotropy that is orthogonal to the magnetic anisotropy of the tilting magnetic layer structure 210.

In various embodiments, the pinning magnetic layer structure may include a pinning magnetic layer and a compensating magnetic layer antiferromagnetically coupled to each other. As the pinning magnetic layer and the compensating magnetic layer are antiferromagnetically coupled to each other, the respective magnetization orientations of the pinning magnetic layer and the compensating magnetic layer are aligned antiparallel to each other.

In various embodiments, the pinning magnetic layer structure may include a synthetic antiferromagnetic (SAF) structure, where the pinning magnetic layer and the compensating magnetic layer, by being antiferromagnetically coupled to each other, form the SAF structure.

The compensating magnetic layer may be arranged proximal to the tilting magnetic layer structure 210. The pinning magnetic layer may be arranged proximal to the fixed magnetic layer structure 204, for example, in contact with the fixed magnetic layer structure 204.

In various embodiments, the pinning magnetic layer structure may further include a non-magnetic spacer layer in between the pinning magnetic layer and the compensating magnetic layer.

In various embodiments, the magnetoresistive device 200 may further include a spacer layer (e.g., a non-magnetic spacer layer, e.g., an interlayer exchange coupling layer) in between the pinning magnetic layer structure and the tilting magnetic layer structure 210, the spacer layer including a material that enables interlayer exchange coupling between the tilting magnetic layer structure 210 and the pinning magnetic layer structure.

In various embodiments, the axis (e.g., easy axis) along which the magnetization orientation of the tilting magnetic layer structure 210 is aligned may be at least substantially orthogonal (or perpendicular) to the corresponding axes (e.g., easy axes) of the pinning magnetic layer and the compensating magnetic layer.

In various embodiments, the pinning magnetic layer may pin the fixed magnetization orientation of the fixed magnetic layer structure 204.

In various embodiments, the compensating magnetic layer may help to reduce stray field from the fixed magnetic layer structure 204, thereby achieving a magnetically unbiased free magnetic layer structure 202. For example, the compensating magnetic layer may compensate for the stray field from the fixed magnetic layer structure 204. In this way, a compensated fixed magnetic layer structure may be provided.

In various embodiments, the tilting magnetic layer structure 210 may be interlayer exchange coupled to the compensating magnetic layer.

In various embodiments, the tilting magnetic layer structure 210 may be interlayer exchange coupled to the pinning magnetic layer.

The magnetoresistive device 200 may further include an antiferromagnetic (AFM) layer magnetically coupled to the tilting magnetic layer structure 210. The antiferromagnetic layer may be arranged in contact with the tilting magnetic layer structure 210. The pinning magnetic layer structure and the antiferromagnetic layer may be arranged on opposite sides of the tilting magnetic layer structure 210. The antiferromagnetic layer may have magnetic moments aligned parallel to and anti-parallel to the magnetization orientation of the tilting magnetic layer structure 210. The antiferromagnetic layer may help to improve the thermal stability of the tilting magnetic layer structure 210.

In various embodiments, the tilting magnetic layer structure 210 may include a synthetic antiferromagnetic (SAF) structure having a first tilting magnetic layer and a second tilting magnetic layer antiferromagnetically coupled to each other. As the first tilting magnetic layer and the second tilting magnetic layer are antiferromagnetically coupled to each other, the respective magnetization orientations of the first tilting magnetic layer and the second tilting magnetic layer are aligned antiparallel to each other. The synthetic antiferromagnetic (SAF) structure of the tilting magnetic layer structure 210 may reduce the value of stray fields that may act on the free magnetic layer structure 202 and/or on potential neighboring magnetoresistive devices, for example, in a memory arrangement having a plurality of magnetoresistive devices.

In various embodiments, the tilting magnetic layer structure 210 may further include a spacer layer (e.g., a non magnetic spacer layer, e.g., an interlayer exchange coupling layer) in between the first tilting magnetic layer and the second tilting magnetic layer.

The magnetoresistive device 200 may further include an antiferromagnetic (AFM) layer magnetically coupled to the synthetic antiferromagnetic (SAF) structure of the tilting magnetic layer structure 210. For example, the antiferromagnetic layer may be magnetically coupled to the second tilting magnetic layer. The second tilting magnetic layer may be arranged proximal to the antiferromagnetic layer, for example, the antiferromagnetic layer may be arranged in contact with the second tilting magnetic layer. The first tilting magnetic layer may be arranged proximal to the pinning magnetic layer structure. The pinning magnetic layer structure and the antiferromagnetic layer may be arranged on opposite sides of the synthetic antiferromagnetic (SAF) structure of the tilting magnetic layer structure 210. The antiferromagnetic layer may have magnetic moments aligned parallel to and anti-parallel to the magnetization orientations of the first tilting magnetic layer and the second tilting magnetic layer. The antiferromagnetic layer may help to improve the thermal stability of the synthetic antiferromagnetic (SAF) structure of the tilting magnetic layer structure 210.

In the context of various embodiments, an interlayer exchange coupling layer may possess at least one interlayer exchange coupling mechanism, for example, Ruderman-Kittel-Kasuya-Yosida (RKKY) coupling, superexchange coupling, double exchange coupling, etc.

In the context of various embodiments, an interlayer exchange coupling layer may provide thermal stability for the magnetoresistive device 200.

In the context of various embodiments, the resistance state of the magnetoresistive device 200 may change as a result of a change in its resistivity.

The fixed magnetic layer structure 204, the free magnetic layer structure 202 and the tilting magnetic layer structure 210 may form part of or may be part of a magnetic magnetic junction (e.g., a magnetic tunnel junction (MTJ)) of the magnetoresistive device 200. Other layers as described herein may also be part of or form part of the magnetic junction.

Figure 2B:
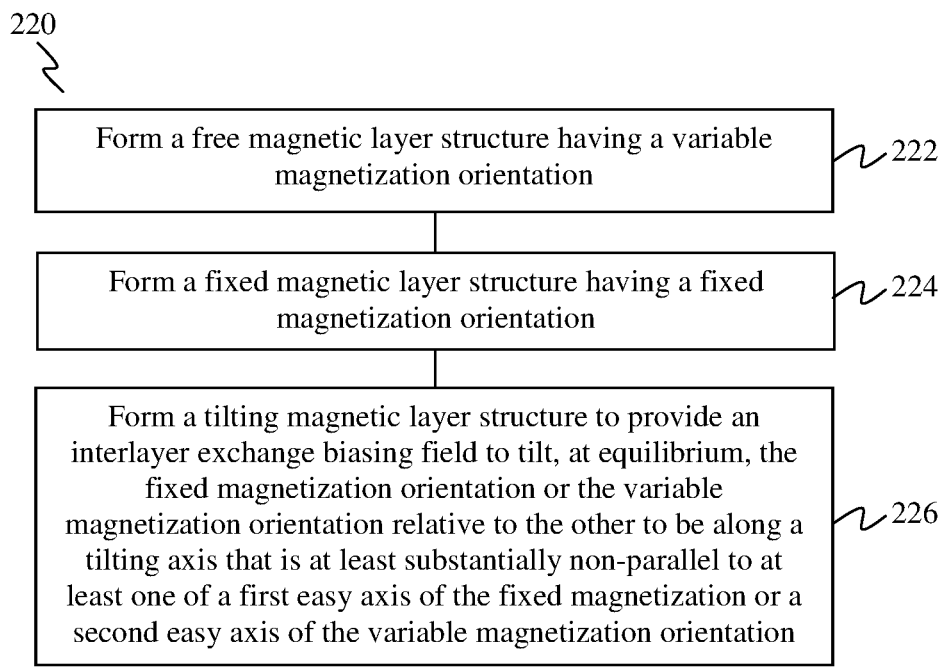
FIG. 2B shows a flow chart illustrating a method of forming a magnetoresistive device, according to various embodiments.

FIG. 2B shows a flow chart 220 illustrating a method of forming a magnetoresistive device, according to various embodiments.

At 222, a free magnetic layer structure having a variable magnetization orientation is formed.

At 224, a fixed magnetic layer structure having a fixed magnetization orientation is formed.

At 226, a tilting magnetic layer structure is formed to provide an interlayer exchange biasing field to tilt, at equilibrium, the fixed magnetization orientation or the variable magnetization orientation relative to the other to be along a tilting axis that is at least substantially non-parallel to at least one of a first easy axis of the fixed magnetization or a second easy axis of the variable magnetization orientation.

The tilting magnetic layer structure has a (fixed) magnetization orientation along an axis (e.g., an easy axis) that may be at least substantially orthogonal (or perpendicular) to at least one of the first easy axis or the second easy axis.

The fixed magnetic layer structure, the free magnetic layer structure and the tilting magnetic layer structure may be arranged one over the other.

It should be appreciated that descriptions in the context of the magnetoresistive device 200 may correspondingly be applicable in relation to the method of forming a magnetoresistive device.

Figure 3:
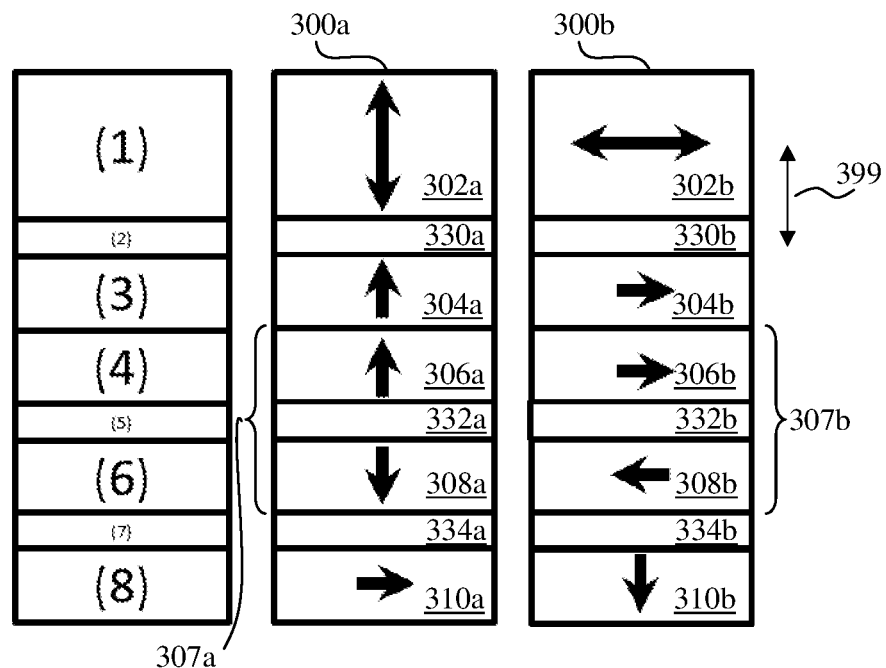
FIG. 3 shows schematic cross-sectional views of magnetoresistive devices, according to various embodiments.

FIG. 3 shows schematic cross-sectional views of magnetoresistive devices 300a, 300b, according to various embodiments, illustrating examples of magnetic junctions (e.g., magnetic tunnel junctions (MTJs)) of the magnetoresistive devices 300a, 300b. The arrow shown within each layer represents the (effective) magnetization orientation (or magnetic moments, or effective magnetic moments) of the layer. The magnetoresistive device 300a may be a perpendicular spin transfer torque magnetic random access memory (pSTT-MRAM), while the magnetoresistive device 300b may be a (in-plane) spin transfer torque magnetic random access memory (STT-MRAM), based on the magnetization orientations of the respective layers of the magnetoresistive devices 300a, 300b relative to the growth direction, defined vertically (represented by the double-headed arrow 399) in FIG. 3.

Each magnetoresistive device 300a, 300b may include a free magnetic layer structure (or free layer) (layer (1)) 302a, 302b having a variable magnetization orientation, a non-magnetic spacer layer (layer (2)) 330a, 330b, a fixed magnetic layer structure (or reference layer) (layer (3)) 304a, 304b having a fixed magnetization orientation, a pinning layer (layer (4)) 306a, 306b, a non-magnetic spacer layer (layer (5)) 332a, 332b, and a compensating magnetic layer (layer (6)) 308a, 308b, which may be as described in the context of the magnetoresistive devices 180a, 180b of FIG. 1. The pinning layer 306a, 306b and the compensating magnetic layer 308a, 308b may form a synthetic antiferromagnetic (SAF) structure (or synthetic antiferromagnet) 307a, 307b. The pinning layer 306a, 306b and the compensating magnetic layer 308a, 308b may define a pinning magnetic layer structure.

In various embodiments, the free magnetic layer structure 302a, 302, the non-magnetic spacer layer 330a, 330b, the fixed magnetic layer structure 304a, 304b, the pinning layer 306a, 306b, the non-magnetic spacer layer 332a, 332b, and the compensating magnetic layer 308a, 308b may constitute a magnetic tunnel junction (MTJ) with a synthetic antiferromagnetic (SAF) structure 307a, 307b.

The compensating magnetic layer 308a, 308b may be magnetically coupled to a (first) tilting magnetic layer structure (or tilting magnetic layer) (layer (8)) 310a, 310b through a spacer layer (layer (7)) 334a, 334b. The spacer layer 334a, 334b may be non-magnetic. The magnetization orientation the tilting magnetic layer structure 310a, 310b may be perpendicular to the direction of the magnetization of the layer it is coupled to, e.g., compensating magnetic layer 308a, 308b in the magnetoresistive devices 300a, 300b of FIG. 3. The magnetization orientation of the tilting magnetic layer structure 310a, 310b may be at least substantially orthogonal to the magnetization orientation of the fixed magnetic layer structure 304a, 304b.

As described above, the tilting magnetic layer structure 310a, 310b may be coupled to the compensating magnetic layer 308a, 308b through the spacer layer 334a, 334b. The compensating magnetic layer 308a, 308b may then be coupled to the pinning layer 306a, 306b and the fixed magnetic layer structure (or reference layer) 304a, 304b via the non-magnetic spacer layer 332a, 332b. In this way, the compensating magnetic layer 308a, 308b and the pinning layer 306a, 306b may be arranged in between the tilting magnetic layer structure 310a, 310b and the fixed magnetic layer structure 304a, 304b, meaning that the tilting magnetic layer structure 310a, 310b may not be in close proximity to the fixed magnetic layer structure 304a, 304b.

Further, the stray field from the fixed magnetic layer structure 304a, 304b may be reduced by the compensating magnetic layer 308a, 308b, thereby achieving a magnetically unbiased free magnetic layer structure (or free layer) 302a, 302b. As a result, the free magnetic layer structure 302a, 302b may have no preferential switching direction while writing, i.e., changing its orientation, thereby increasing the reliability and feasibility of the magnetoresistive device 300a, 300b.

Having a coupling mechanism between the tilting magnetic layer structure 310a, 310b and fixed magnetic layer structure 304a, 304b in the form of exchange biasing field, and having a stack design with a compensated fixed magnetic layer structure (or compensated reference layer) 304a, 304b may offer considerable advantages, for example, in terms of scalability and reliability.

The inclusion of an interlayer exchange coupling layer (spacer layer 334a, 334b) provides further thermal stability. Further, the magnetoresistive device 300a, 300b that depends on magnetisation values, may compensate for a decrease in the magnetisation of the tilting magnetic layer structure 310a, 310b by having the inter-layer exchange tuned. Therefore, various embodiments may achieve an increased thermal stability under device manufacturing conditions.

In various embodiments, the tilting magnetic layer structure 310a, 310b may include or may be composed of any ferromagnetic material, alloy or multilayers such as but not limited to cobalt (Co), iron (Fe), nickel (Ni), manganese (Mn), cobalt-iron ($Co_xFe_{1-x}$), iron-platinum ($Fe_xPt_{1-x}$), iron-boron (FeB), cobalt-iron-boron (CoFeB), nickel-iron (NiFe), multilayers of alternating cobalt and platinum [Co/Pt], multilayers of alternating cobalt and palladium [Co/Pd], multilayers of alternating cobalt and nickel [Co/Ni], multilayers of alternating iron and terbium [Fe/Tb], etc., or any combination thereof.

In various embodiments, the spacer layer 334a, 334b may be composed of any material which possesses at least one interlayer exchange coupling mechanism (e.g., rhodium (Rh), ruthenium (Ru), ruthenium-tantalum ($Ru_xTa_{1-x}$), cobalt-ruthenium ($Co_xRu_{1-x}$), tantalum (Ta), chromium (Cr), etc.) such as Ruderman-Kittel-Kasuya-Yosida (RKKY) coupling, superexchange coupling, double exchange coupling (also known as Zener coupling), etc.

As described above, the magnetoresistive devices 300a, 300b may be respectively a pSTT-MRAM and a STT-MRAM, with a tilting magnetic layer structure (or one tilting layer) 310a, 310b exchange coupled to the compensating magnetic layer 308a, 308b.

It should be appreciated that the magnetoresistive devices 300a, 300b, including the different layers therein, may also be as described in the context of the magnetoresistive device 200.

Figure 4:
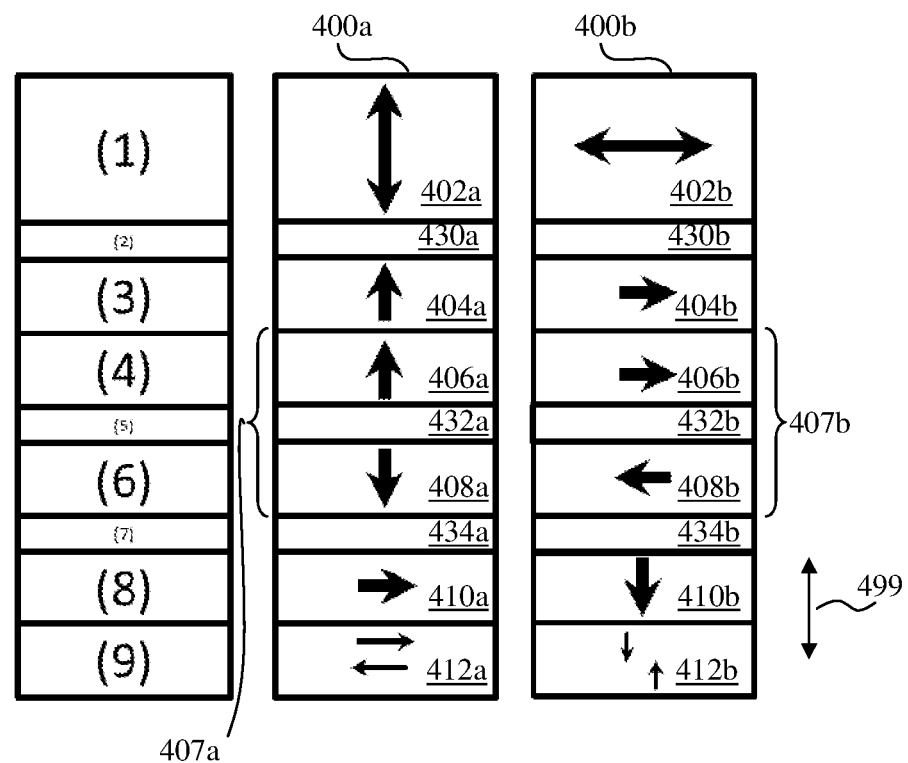
FIG. 4 shows schematic cross-sectional views of magnetoresistive devices, according to various embodiments.

FIG. 4 shows schematic cross-sectional views of magnetoresistive devices 400a, 400b, according to various embodiments, illustrating examples of magnetic junctions (e.g., magnetic tunnel junctions (MTJs)) of the magnetoresistive devices 400a, 400b. The arrow shown within each layer represents the (effective) magnetization orientation (or magnetic moments, or effective magnetic moments) of the layer. The magnetoresistive device 400a may be a perpendicular spin transfer torque magnetic random access memory (pSTT-MRAM), while the magnetoresistive device 400b may be a (in-plane) spin transfer torque magnetic random access memory (pSTT-MRAM), based on the magnetization orientations of the respective layers of the magnetoresistive devices 400a, 400b relative to the growth direction, defined vertically (represented by the double-headed arrow 499) in FIG. 4.

Each magnetoresistive device 400a, 400b may include a free magnetic layer structure (or free layer) (layer (1)) 402a, 402b having a variable magnetization orientation, a non-magnetic spacer layer (layer (2)) 430a, 430b, a fixed magnetic layer structure (or reference layer) (layer (3)) 404a, 404b having a fixed magnetization orientation, a pinning layer (layer (4)) 406a, 406b, a non-magnetic spacer layer (layer (5)) 432a, 432b, a compensating magnetic layer (layer (6)) 408a, 408b, a spacer layer (layer (7)) 434a, 434b, and a tilting magnetic layer structure (layer (8)) 410a, 410b, which may be as described in the context of the magnetoresistive devices 180a, 180b, 300a, 300b. The pinning layer 406a, 406b and the compensating magnetic layer 408a, 408b may form a synthetic antiferromagnetic (SAF) structure (or synthetic antifferomagnet) 407a, 407b. The pinning layer 406a, 406b and the compensating magnetic layer 408a, 408b may define a pinning magnetic layer structure.

The (first) tilting magnetic layer or tilting magnetic layer structure 410a, 410b may be coupled to an antiferromagnetic layer (layer (9)) 412a, 412b in order to increase its thermal stability. The antiferromagnetic layer 412a, 412b may act as a biasing layer or a pinning layer to the tilting magnetic layer structure 410a, 410b. The antiferromagnetic layer (layer (9)) 412a, 412b may have magnetic moments that are aligned in opposite directions. In other words, some magnetic moments of the antiferromagnetic layer 412a, 412b may be aligned parallel to the magnetization orientation of the tilting magnetic layer structure 410a, 410b, while some other magnetic moments of the antiferromagnetic layer 412a, 412b may be aligned antiparallel to the magnetization orientation of the tilting magnetic layer structure 410a, 410b.

As described above, the magnetoresistive devices 400a, 400b may be respectively a pSTT-MRAM and a STT-MRAM, with a tilting magnetic layer structure 410a, 410b exchange coupled to the compensating magnetic layer 408a, 408b, with the tilting magnetic layer structure 410a, 410b itself (magnetically) coupled to an antiferromagnet or an antiferromagnetic layer 412a, 412b.

It should be appreciated that the magnetoresistive devices 400a, 400b, including the different layers therein, may also be as described in the context of the magnetoresistive device 200.

Figure 5:
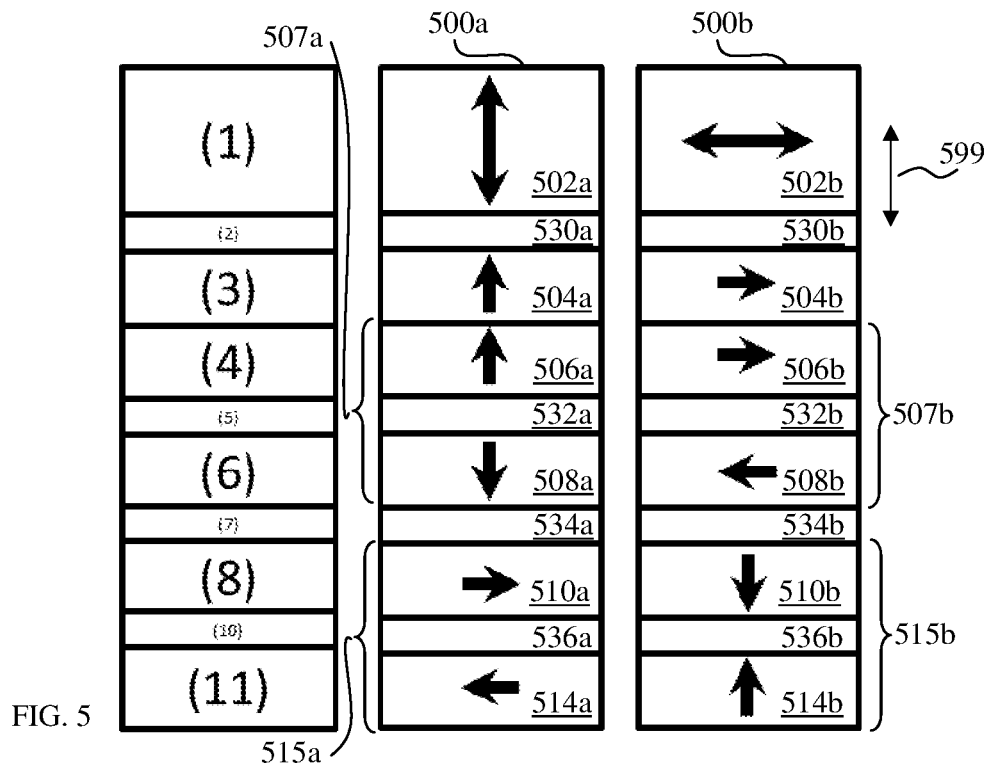
FIG. 5 shows schematic cross-sectional views of magnetoresistive devices, according to various embodiments.

FIG. 5 shows schematic cross-sectional views of magnetoresistive devices 500a, 500b, according to various embodiments, illustrating examples of magnetic junctions (e.g., magnetic tunnel junctions (MTJs)) of the magnetoresistive devices 500a, 500b. The arrow shown within each layer represents the (effective) magnetization orientation (or magnetic moments, or effective magnetic moments) of the layer. The magnetoresistive device 500a may be a perpendicular spin transfer torque magnetic random access memory (pSTT-MRAM), while the magnetoresistive device 500b may be a (in-plane) spin transfer torque magnetic random access memory (pSTT-MRAM), based on the magnetization orientations of the respective layers of the magnetoresistive devices 500a, 500b relative to the growth direction, defined vertically (represented by the double-headed arrow 599) in FIG. 5.

Each magnetoresistive device 500a, 500b may include a free magnetic layer structure (or free layer) (layer (1)) 502a, 502b having a variable magnetization orientation, a non-magnetic spacer layer (layer (2)) 530a, 530b, a fixed magnetic layer structure (or reference layer) (layer (3)) 504a, 504b having a fixed magnetization orientation, a pinning layer (layer (4)) 506a, 506b, a non-magnetic spacer layer (layer (5)) 532a, 532b, a compensating magnetic layer (layer (6)) 508a, 508b, a spacer layer (layer (7)) 534a, 534b, and a tilting magnetic layer structure (layer (8)) 510a, 510b, which may be as described in the context of the magnetoresistive devices 180a, 180b, 300a, 300b. The pinning layer 506a, 506b and the compensating magnetic layer 508a, 508b may form a synthetic antiferromagnetic (SAF) structure (or synthetic antifferomagnet) 507a, 507b. The pinning layer 506a, 506b and the compensating magnetic layer 508a, 508b may define a pinning magnetic layer structure.

The compensating magnetic layer 508a, 508b may be coupled to a synthetic antiferromagnetic (SAF) structure 515a, 515b which includes the (first) tilting magnetic layer structure (or first tilting magnetic layer) 508a, 508b, a spacer layer (layer (10)) 536a, 536b and another tilting magnetic layer structure (or second tilting magnetic layer) (layer (11)) 514a, 514b. The spacer layer 536a, 536b may be non-magnetic. In the SAF structure 515a, 515b, the first tilting magnetic layer structure 508a, 508b and the second tilting magnetic layer structure 514a, 514b are antiferromagnetically coupled to each other. This may mean that the magnetization orientation of the second tilting magnetic layer structure 514a, 514b is aligned antiparallel to the direction of magnetization (or magnetization orientation) of the first tilting magnetic layer structure 508a, 508b, as it is coupled antiferromagnetically. The role of the synthetic antiferromagnet 515a, 515b is to reduce the value of the stray fields from the tilting magnetic layer structure 510a, 510b on the free magnetic layer structure 502a, 502b and on potential neighbouring MTJs or magnetoresistive devices.

In various embodiments, the synthetic antiferromagnetic (SAF) structure 515a (and the spacer layer 534a) may constitute an in-plane tilting SAF structure, while the synthetic antiferromagnetic (SAF) structure 515b (and the spacer layer 534b) may constitute an out-of-plane tilting SAF structure.

In various embodiments, the second tilting magnetic layer structure 514a, 514b may include or may be composed of any ferromagnetic material, alloy or multilayers such as but not limited to cobalt (Co), iron (Fe), nickel (Ni), manganese (Mn), cobalt-iron ($Co_xFe_{1-x}$), iron-platinum ($Fe_xPt_{1-x}$), iron-boron (FeB), cobalt-iron-boron (CoFeB), nickel-iron (NiFe), multilayers of alternating cobalt and platinum [Co/Pt], multilayers of alternating cobalt and palladium [Co/Pd], multilayers of alternating cobalt and nickel [Co/Ni], multilayers of alternating iron and terbium [Fe/Tb], etc., or any combination thereof.

In various embodiments, the spacer layer 536a, 536b may be composed of any material which possesses at least one interlayer exchange coupling mechanism (e.g., rhodium (Rh), ruthenium (Ru), ruthenium-tantalum ($Ru_xTa_{1-x}$), cobalt-ruthenium ($Co_xRu_{1-x}$), tantalum (Ta), chromium (Cr), etc.) such as Ruderman-Kittel-Kasuya-Yosida (RKKY) coupling, superexchange coupling, double exchange coupling (also known as Zener coupling), etc.

As described above, the magnetoresistive devices 500a, 500b may be respectively a pSTT-MRAM and a STT-MRAM, with a tilting magnetic layer structure (or one tilting layer) 510a, 510b exchange coupled to the compensating magnetic layer 508a, 508b, where the tilting magnetic layer structure 510a, 510b may form part of a synthetic antiferromagnet or a synthetic antiferromagnetic (SAF) structure 515a, 515b. The synthetic antiferromagnetic (SAF) structure 515a, 515b includes a second tilting magnetic layer structure 514a, 514b.

It should be appreciated that the magnetoresistive devices 500a, 500b, including the different layers therein, may also be as described in the context of the magnetoresistive device 200.

Figure 6:
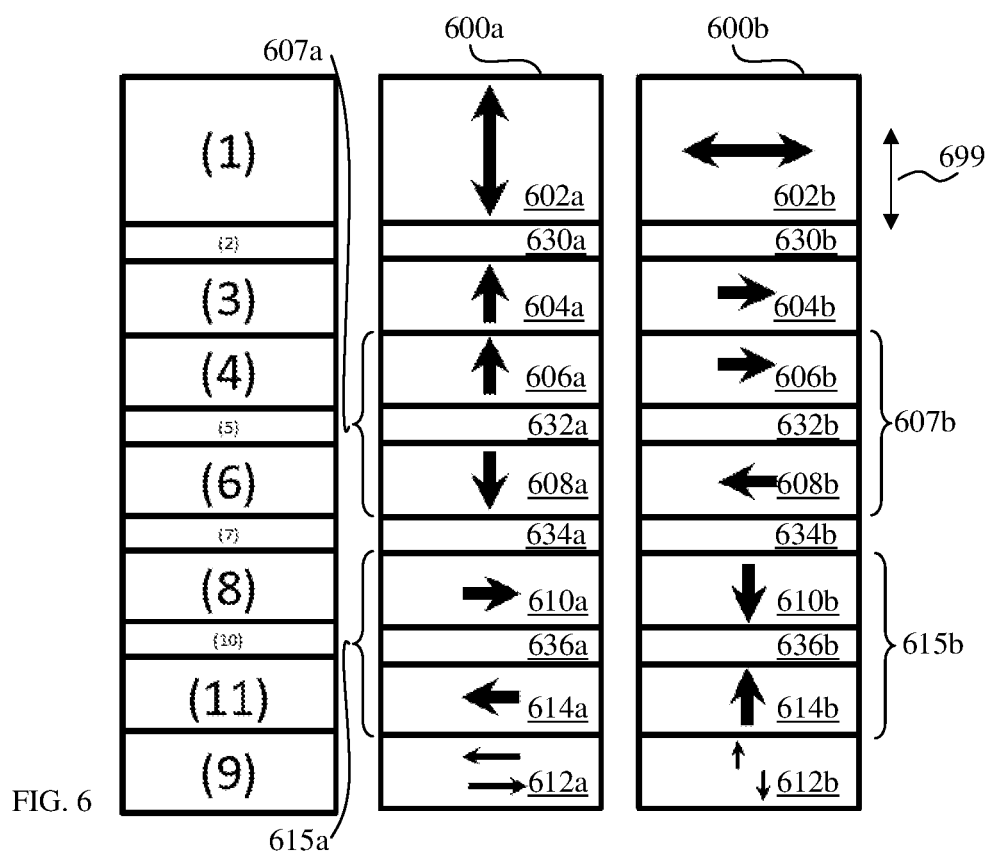
FIG. 6 shows schematic cross-sectional views of magnetoresistive devices, according to various embodiments.

FIG. 6 shows schematic cross-sectional views of magnetoresistive devices 600a, 600b, according to various embodiments, illustrating examples of magnetic junctions (e.g., magnetic tunnel junctions (MTJs)) of the magnetoresistive devices 600a, 600b. The arrow shown within each layer represents the (effective) magnetization orientation (or magnetic moments, or effective magnetic moments) of the layer. The magnetoresistive device 600a may be a perpendicular spin transfer torque magnetic random access memory (pSTT-MRAM), while the magnetoresistive device 600b may be a (in-plane) spin transfer torque magnetic random access memory (pSTT-MRAM), based on the magnetization orientations of the respective layers of the magnetoresistive devices 600a, 600b relative to the growth direction, defined vertically (represented by the double-headed arrow 699) in FIG. 6.

Each magnetoresistive device 600a, 600b may include a free magnetic layer structure (or free layer) (layer (1)) 602a, 602b having a variable magnetization orientation, a non-magnetic spacer layer (layer (2)) 630a, 630b, a fixed magnetic layer structure (or reference layer) (layer (3)) 604a, 604b having a fixed magnetization orientation, a pinning layer (layer (4)) 606a, 606b, a non-magnetic spacer layer (layer (5)) 632a, 632b, a compensating magnetic layer (layer (6)) 608a, 608b, a spacer layer (layer (7)) 634a, 634b, a (first) tilting magnetic layer structure (layer (8)) 610a, 610b, a spacer layer (layer (10)) 636a, 636b, another (second) tilting magnetic layer structure (layer (11)) 614a, 614b, and an antiferromagnetic layer (layer (9)) 612a, 612b, which may be as described in the context of the magnetoresistive devices 180a, 180b, 300a, 300b, 400a, 400b, 500a, 500b. The pinning layer 606a, 606b and the compensating magnetic layer 608a, 608b may form a synthetic antiferromagnetic (SAF) structure (or synthetic antiferromagnet) 607a, 607b. The pinning layer 606a, 606b and the compensating magnetic layer 608a, 608b may define a pinning magnetic layer structure. The first tilting magnetic layer structure (or first tilting magnetic layer) 610a, 610b and the second tilting magnetic layer structure (or second tilting magnetic layer) 614a, 614b defines a synthetic antiferromagnetic (SAF) structure 615a, 615b.

As compared to the magnetoresistive devices 500a, 500b, the second tilting magnetic layer structure 614a, 614b of the magnetoresistive devices 600a, 600b may also be (magnetically) coupled to the antiferromagnetic layer 612a, 612b in order to increase its thermal stability.

As described above, the magnetoresistive devices 600a, 600b may be respectively a pSTT-MRAM and a STT-MRAM, with a tilting magnetic layer structure (or one tilting layer) 610a, 610b exchange coupled to the compensating magnetic layer 608a, 608b, where the tilting magnetic layer structure 610a, 610b may form part of a synthetic antiferromagnet or a synthetic antiferromagnetic (SAF) structure 615a, 615b. The synthetic antiferromagnetic (SAF) structure 615a, 615b includes a second tilting magnetic layer structure 614a, 614b that is itself (magnetically) coupled to an antiferromagnet or an antiferromagnetic layer 612a, 612b.

It should be appreciated that the magnetoresistive devices 600a, 600b, including the different layers therein, may also be as described in the context of the magnetoresistive device 200.

In various embodiments, it should be appreciated that the tilting magnetic layer structure (layer (8)) (e.g., 310a, 310b, 410a, 410b, 510a, 510b, 610a, 610b) may be coupled through the spacer layer (layer (7)) (e.g., 334a, 334b, 434a, 434b, 534a, 534b, 634a, 634b) to either the fixed magnetic layer structure (or reference layer) (layer (3)) (e.g., 304a, 304b, 404a, 404b, 504a, 504b, 604a, 604b) or the pinning layer (layer (4)) (e.g., 306a, 306b, 406a, 406b, 506a, 506b, 606a, 606b), instead of being coupled to the compensating magnetic layer (layer (6)) (e.g., 308a, 308b, 408a, 408b, 508a, 508b, 608a, 608b), depending on the chosen structure for the magnetoresistive device or the MTJ.

In various embodiments, it should be appreciated that the tilting magnetic layer structure (layer (8)) (e.g., 310a, 310b, 410a, 410b, 510a, 510b, 610a, 610b) may be coupled through the spacer layer (layer (7)) (e.g., 334a, 334b, 434a, 434b, 534a, 534b, 634a, 634b) to the free magnetic layer structure (or free layer) (layer (1)) (e.g., 302a, 302b, 402a, 402b, 502a, 502b, 602a, 602b) instead of being coupled to the compensating magnetic layer (layer (6)) (e.g., 308a, 308b, 408a, 408b, 508a, 508b, 608a, 608b), for example, depending on the chosen structure for the magnetoresistive device or the MTJ.

It should be appreciated that various embodiments may be applicable to either bottom-pinned or top-pinned magnetoresistive devices or MTJs. For example, one or more magnetic layers configured to pin the magnetization of a reference layer may be provided towards the bottom of the magnetoresistive device or at least arranged below the reference layer in a bottom-pinned magnetoresistive device, or may be provided towards the top of the magnetoresistive device or at least arranged above the reference layer in a top-pinned magnetoresistive device.

Micromagnetics simulation may be carried out based on the parameters found in Table 1 for a perpendicular MTJ, for example, the structure corresponding to the magnetoresistive device (e.g., pSTT-MRAM) 500a illustrated in FIG. 5. The results of the simulation are as described below.

TABLE 1

Parameters used for micromagnetics simulation.

| Layer | Material | Ms [MA/m$^3$] | Ku [MJ/m$^3$] | Thickness [nm] |
|---|---|---|---|---|
| Free layer (layer (1)) | CoFeB-based | 1.1 | 1 | 2 |
| Reference layer + pinning layer (layers (3 + 4)) | CoFeB | 1.0 | 0.6 | 3 |
| Spacer layers (layers (5, 7 and 10)) | Ru IEC = −1 mJ/m$^2$ | N/A | N/A | 1 |
| Compensating layer (layer (6)) | [Co$_{0.5}$/Pt$_{0.2}$]$_7$ | 1.0 | 1 | 5 |
| First tilting layer (layer ((8)) | Co, Fe, CoFe, CoFeB, FeB, | 0.75-1.5 | N/A | 1-5 |
| Second tilting layer (layer (11)) | NiFe, Ni, etc. | 1.0 | N/A | 1-6 |

Ms=saturation magnetization, Ku=uniaxial anisotropy constant, the notation [Co$_{0.5}$/Pt$_{0.2}$]$_7$ for the compensating layer means that the compensating layer includes a multilayer structure having alternating layers of 0.5 nm thick cobalt layer and 0.2 nm thick platinum layer, where the total number of the cobalt layer in the multilayer structure is 7 and the total number of the platinum layer in the multilayer structure is 7.

In Table 1, the reference layer may be an OP (out-of-plane) reference layer, the compensating layer may be an OP (out-of-plane) compensating layer, the first tilting layer may be an IP (in-plane) tilting or bending layer, and the second tilting layer may be an IP (in-plane) tilting or compensating layer. The first tilting layer and the second tilting layer may define an IP (in-plane) tilting SAF structure.

Also, for the structure of the magnetoresistive device of various embodiments, the non-magnetic spacer layer (layer (2)) may be a layer of magnesium oxide (MgO) of a thickness of about 1 nm, and the spacer layers (layers (7) and (10)) may include ruthenium (Ru). One or both of the spacer layers (layers (7) and (10)) may have a thickness of about 1 nm. However, it should be appreciated that, in some embodiments, one or both of the spacer layers (layers (7) and (10)) may be replaced with a respective ferromagnetic coupling layer.

FIGS. 7A-7D show plots 750a, 750b, 750c, 750d of spatially averaged angle between the magnetization orientations of the free magnetic layer structure (free layer $F_1$) and the fixed magnetic layer structure (reference layer $R_1$) for a pSTT-MRAM of various embodiments having an in-plane tilting SAF structure, based on the micromagnetics simulation using the parameters as described above. The in-plane tilting SAF structure includes the first tilting layer 510a and the second tilting layer 514a. The plots 750a, 750b, 750c, 750d provide results for different thicknesses of the first tilting layer and the second tilting layer (layers (8) and (11)) ($IP_1$=thickness of first tilting layer, $IP_2$=thickness of second tilting layer).

As may be observed in plots 750a, 750b, 750c, 750d as a function of $M_s IP_1$, the angle (relative angle), $\delta\theta$, between the magnetization orientations of the reference layer and the free layer, may be increased up to the order of 10°. $\delta\theta$ is stable to thermal vibrations due the stiffness of the reference and free layers.

Figure 7A:
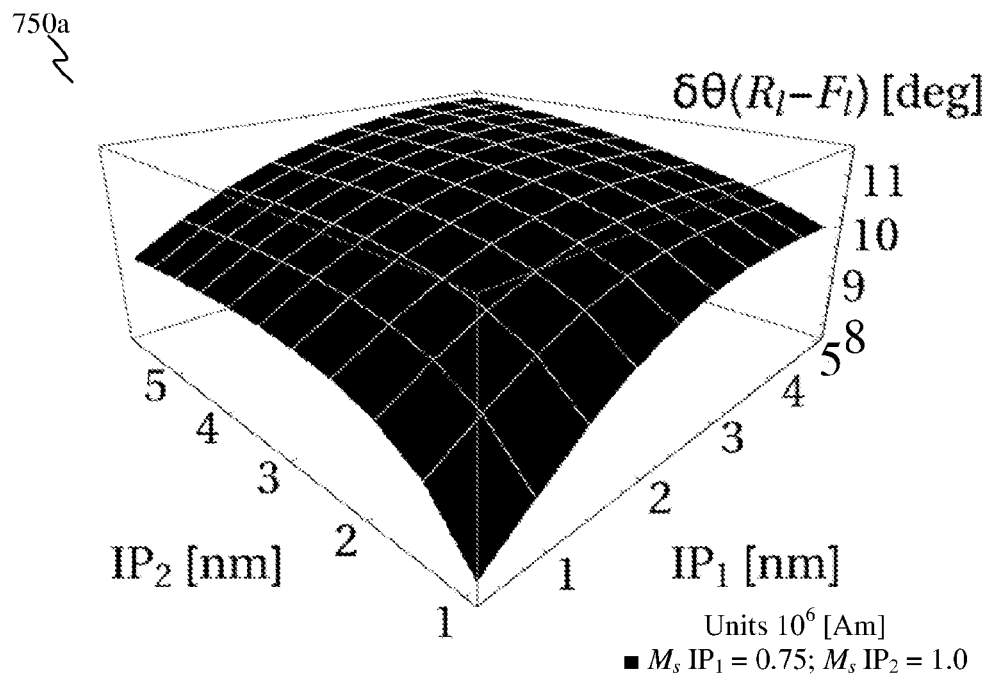
FIGS. 7A-7D show plots of spatially averaged angle between the magnetization orientations of the free magnetic layer structure and the fixed magnetic layer structure for a pSTT-MRAM of various embodiments having an in-plane tilting synthetic antiferromagnetic (SAF) structure.
Figure 7B:
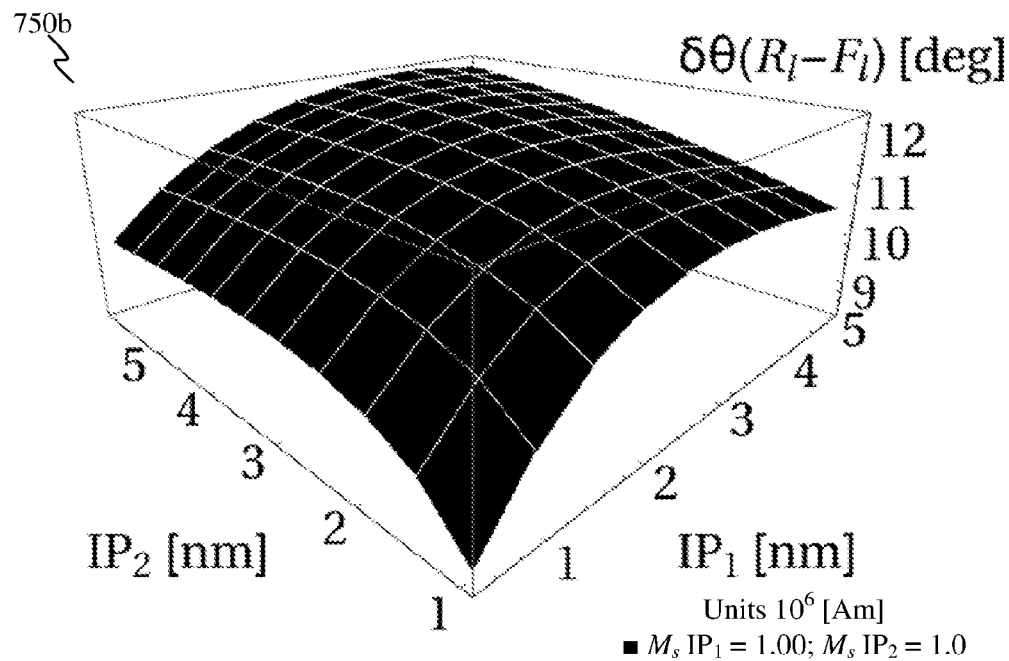
Figure 7C:
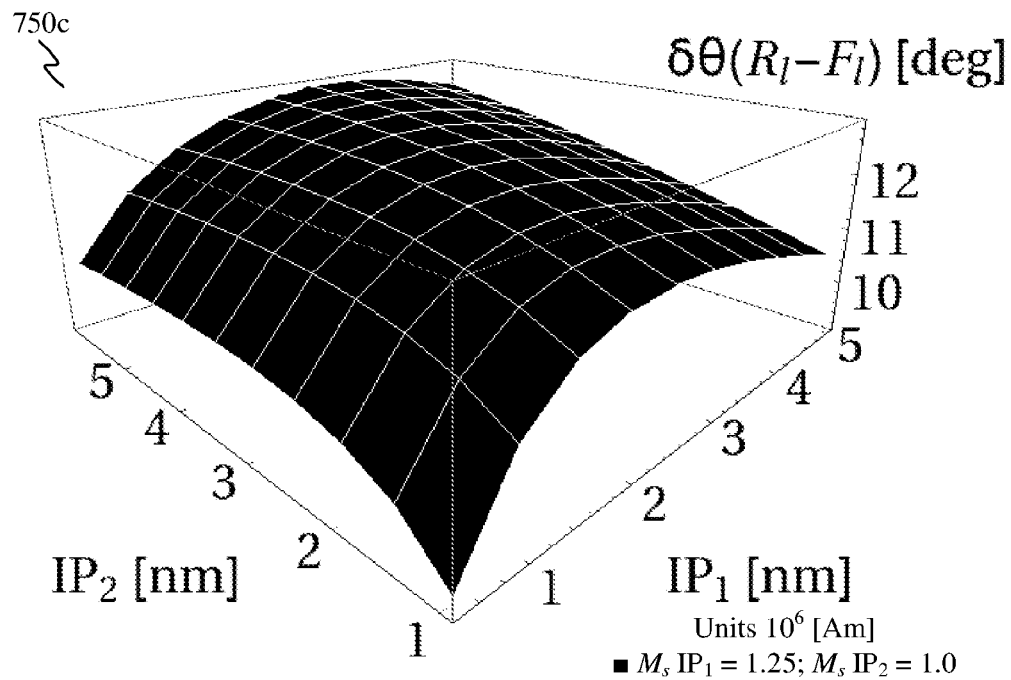
Figure 7D:
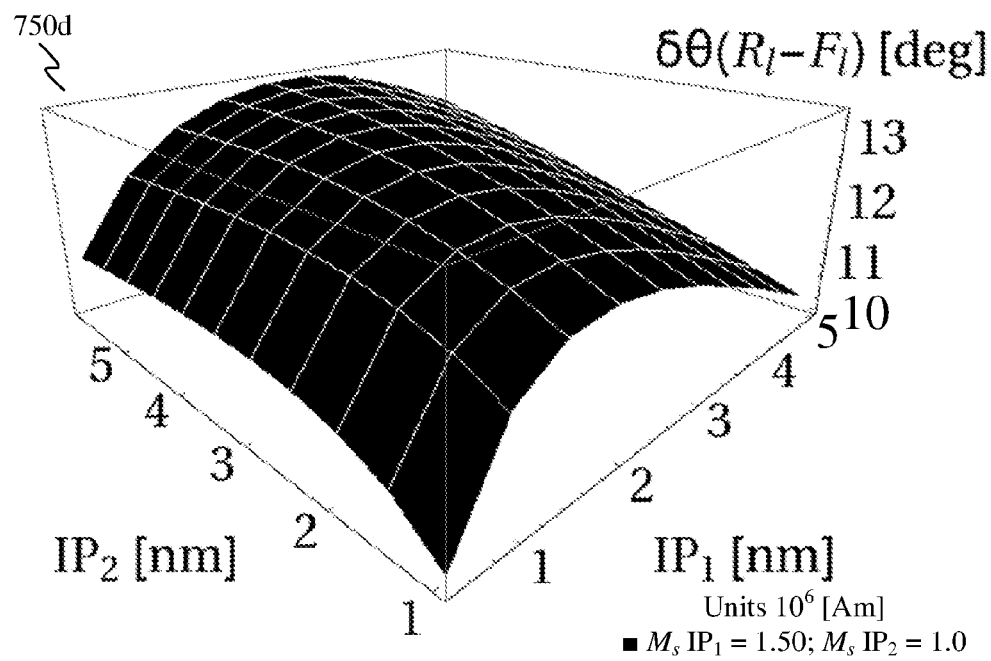
Figure 8A:
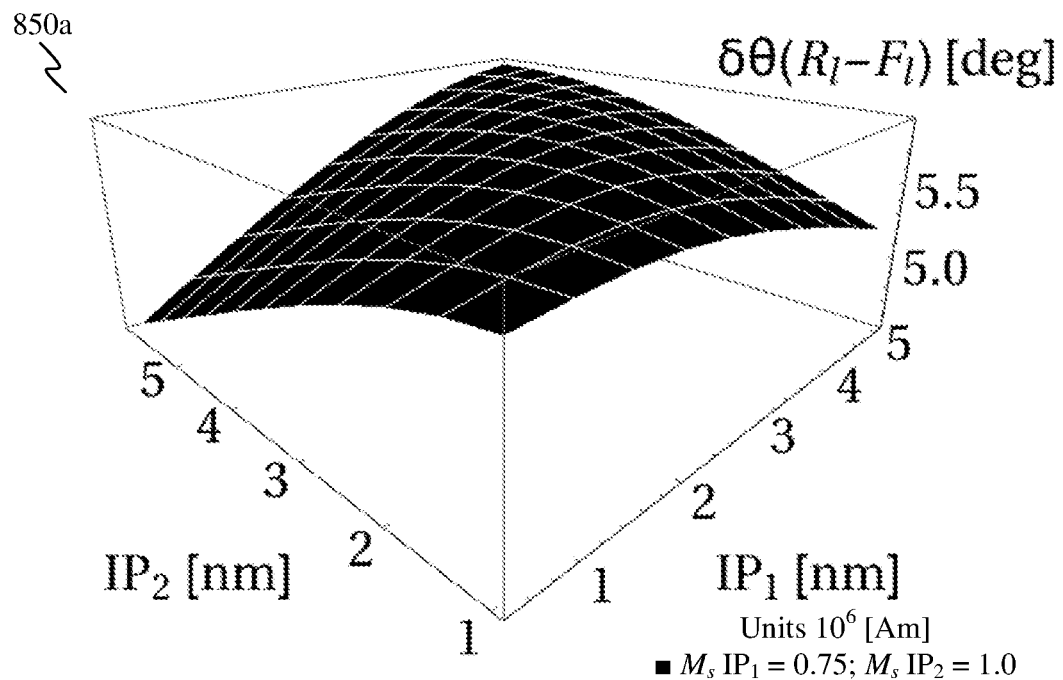
FIGS. 8A-8D show plots of spatially averaged angle between the magnetization orientations of the free magnetic layer structure and the fixed magnetic layer structure for a structure with no exchange coupling.
Figure 8B:
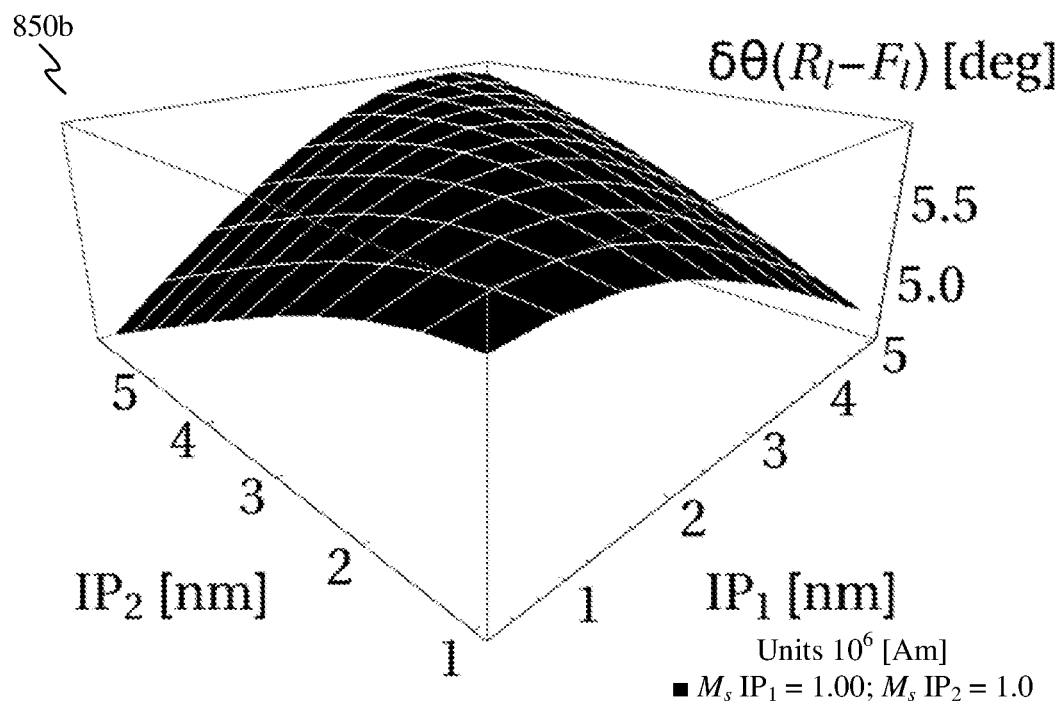
Figure 8C:
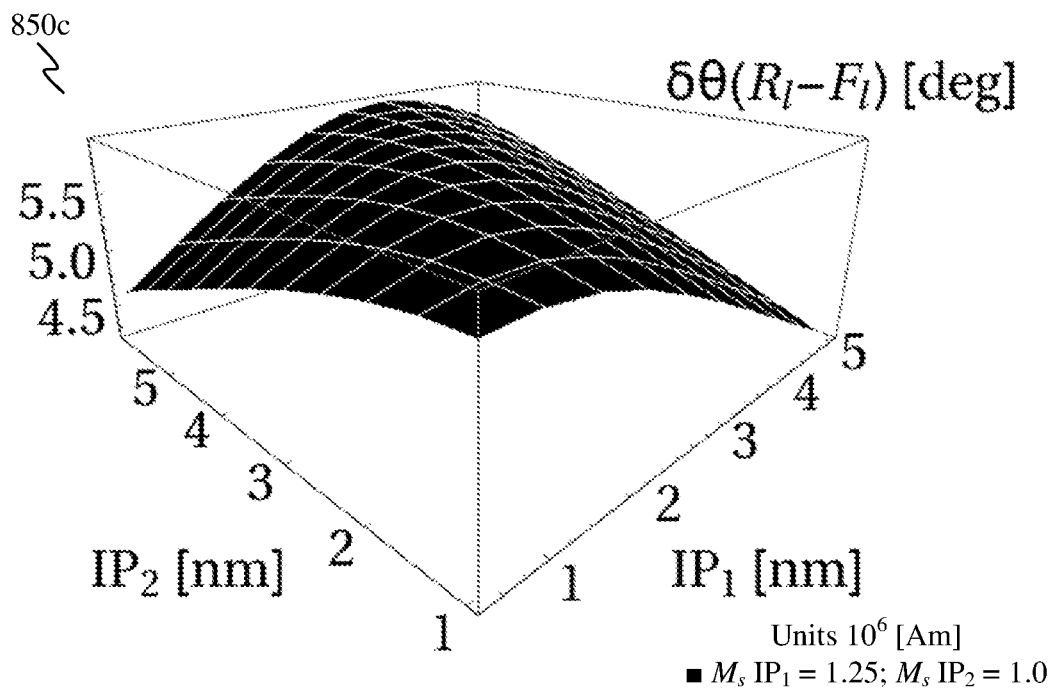
Figure 8D:
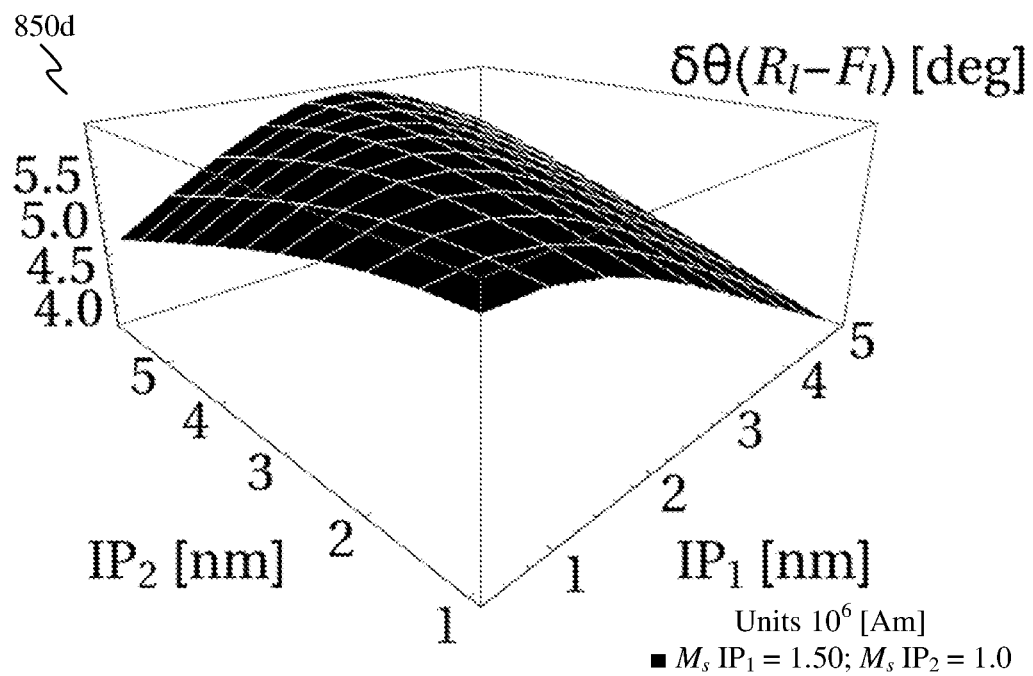
Figure 9A:
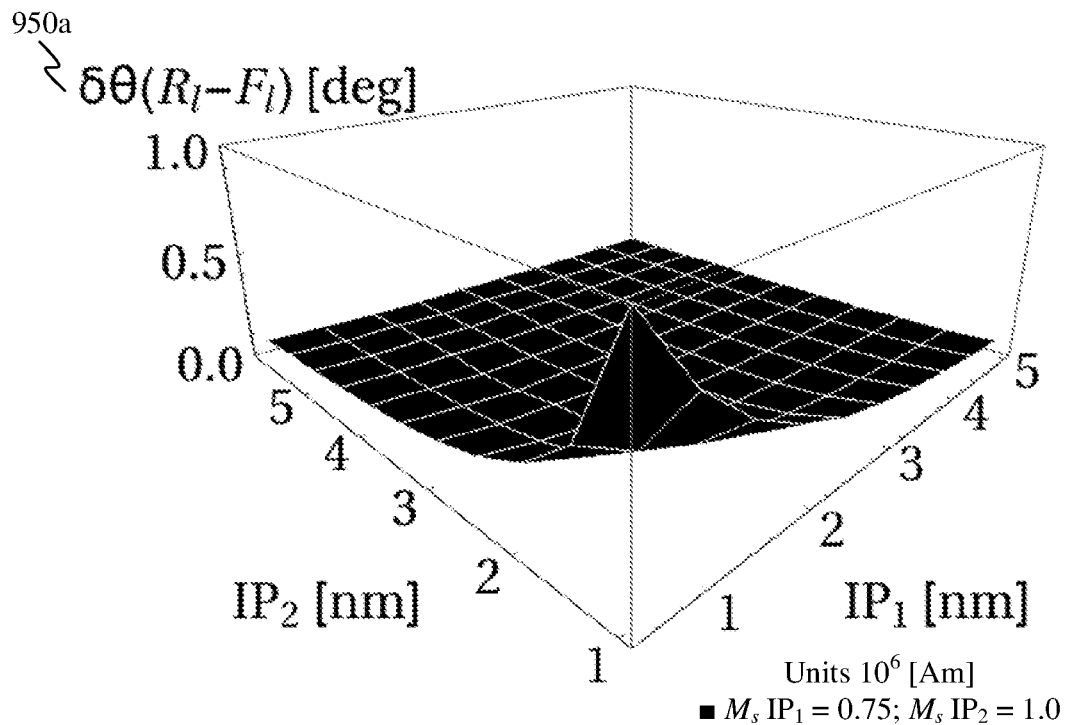
FIGS. 9A-9D show plots of spatially averaged angle between the magnetization orientations of the free magnetic layer structure and the fixed magnetic layer structure for a pSTT-MRAM of various embodiments having an in-plane tilting synthetic antiferromagnetic (SAF) structure and an antiferromagnetic biasing layer.
Figure 9B:
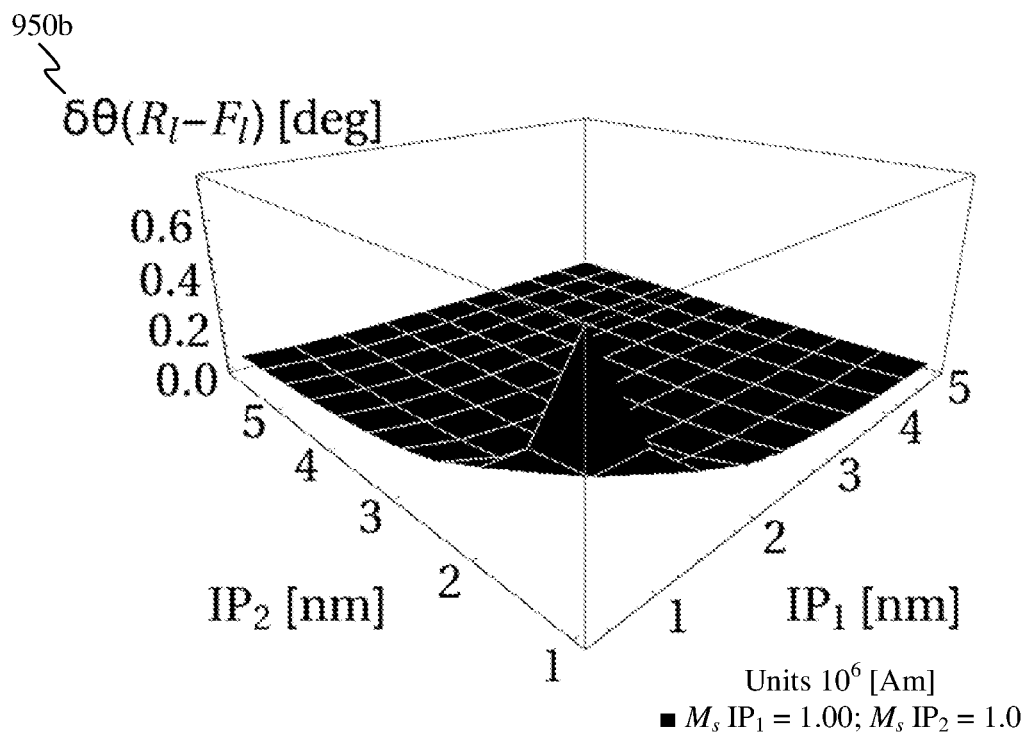
Figure 9C:
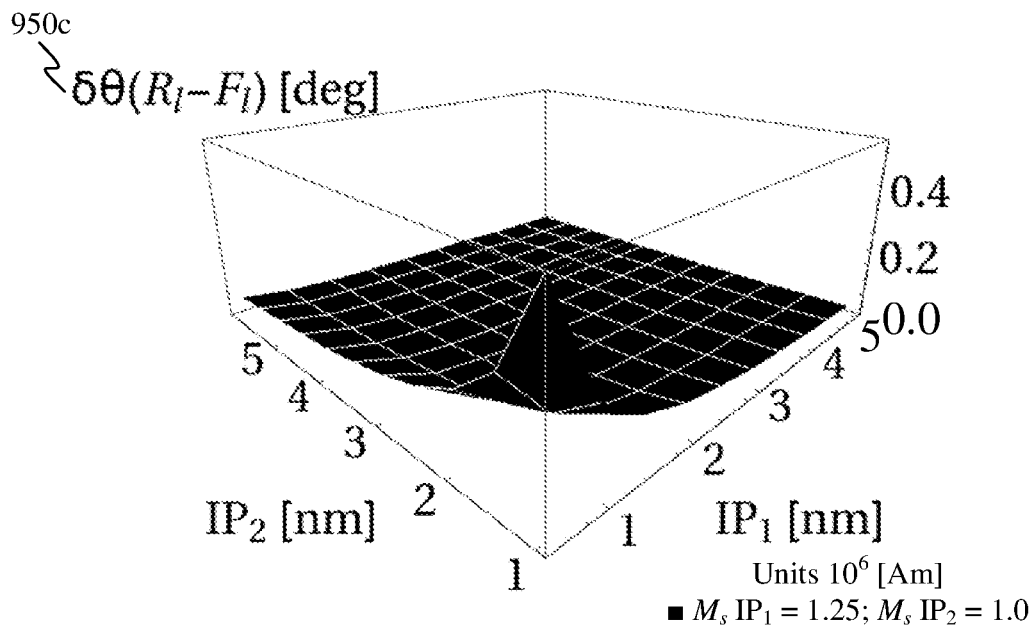
Figure 9D:
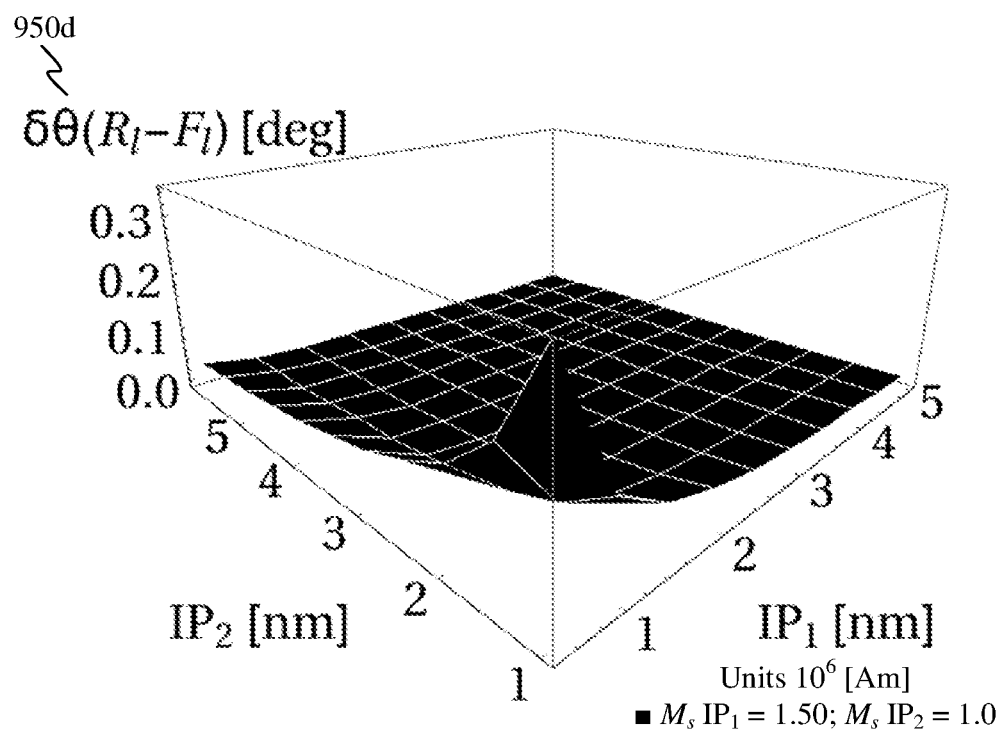

As an example, referring to FIG. 7C, the maximum angle that may be obtained between the free magnetic layer structure (free layer $F_1$) and the fixed magnetic layer structure (reference layer $R_1$) at equilibrium, depending on the thicknesses of the first tilting layer and the second tilting layer, for the case of a pSTT-MRAM, may be essentially as high as 12 degrees.

Further, it is found that the stray field originating from either the first tilting layer or the second tilting layer alone is inefficient in increasing the maximum angle between the free magnetic layer structure (free layer $F_1$) and fixed magnetic layer structure (reference layer $R_1$) at equilibrium and therefore have highlighted the efficiency of various embodiments in increasing the angle at equilibrium between the free magnetic layer structure (free layer $F_1$) and fixed magnetic layer structure (reference layer $R_1$).

FIGS. 8A-8D show plots 850, 850b, 850c, 850d of spatially averaged angle between the magnetization orientations of the free magnetic layer structure (free layer $F_1$) and the fixed magnetic layer structure (reference layer $R_1$) for a structure with no exchange coupling between the compensating magnetic layer and the first tilting magnetic layer structure (layers (6) and (8)). This means that, while the structure may include the first tilting magnetic layer structure and the second tilting magnetic layer structure (layers (8) and (11)), there is no exchange coupling between the fixed magnetic layer structure (or reference layer) (layer (3)) and the tilting magnetic layer structures (layers (8) and (11)), meaning that there are only stray fields.

As may be observed in plots 850, 850b, 850c, 850d as a function of $M_s IP_1$, when no exchange coupling is used, the relative angle, $\delta\theta$, between the free magnetic layer structure (free layer $F_1$) and the fixed magnetic layer structure (reference layer $R_1$) may decrease by approximately 50%, as compared to the results shown in plots 750a, 750b, 750c, 750d (FIGS. 7A-7D).

FIGS. 9A-9D show plots 950a, 950b, 950c, 950d of spatially averaged angle between the magnetization orientations of the free magnetic layer structure (free layer $F_1$) and the fixed magnetic layer structure (reference layer $R_1$) for a pSTT-MRAM of various embodiments having an in-plane tilting SAF structure and an antiferromagnetic biasing layer. The in-plane tilting SAF structure includes the first tilting layer 510a and the second tilting layer 514a, while the antiferromagnetic (AFM) biasing layer/pinning layer may refer to the antiferromagnetic layer 612a (see magnetoresistive device 600a of FIG. 6).

Plots 950a, 950b, 950c, 950d show the results obtained when results between a pSTT-MRAM having a biased in-plane tilting SAF structure (i.e., including an AFM biasing layer) and a pSTT-MRAM having an unbiased in-plane tilting SAF structure (i.e., excluding an AFM biasing layer) are compared to determine how much $\delta\theta_{R1-F1}$ increases when using the AFM biasing layer.

As may be observed in plots 950a, 950b, 950c, 950d as a function of $M_s IP_1$, when the AFM biasing/pinning layer is added to the IP tilting SAF, the relative angle, $\delta\theta$, between the free magnetic layer structure (free layer $F_1$) and the fixed magnetic layer structure (reference layer $R_1$) increases by an additional 0.5°.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A magnetoresistive device comprising:
    a free magnetic layer structure having a variable magnetization orientation;
    a fixed magnetic layer structure having a fixed magnetization orientation;
    a compensating magnetic layer having a magnetization orientation aligned at least substantially antiparallel to the fixed magnetization orientation of the fixed magnetic layer structure; and
    a tilting magnetic layer structure configured to provide an interlayer exchange biasing field to tilt, at equilibrium, the fixed magnetization orientation relative to the variable magnetization orientation to be along a tilting axis that is at least substantially non-parallel to at least one of a first easy axis of the fixed magnetization orientation and a second easy axis of the variable magnetization orientation,
    wherein the tilting magnetic layer structure is interlayer exchange coupled to the compensating magnetic layer via a non-magnetic spacer layer therebetween such that the interlayer exchange biasing field tilts, at equilibrium, the fixed magnetization orientation of the fixed magnetic layer structure to be along the tilting axis.

2. The magnetoresistive device as claimed in claim 1, wherein the tilting magnetic layer structure has a magnetization orientation along an axis that is at least substantially orthogonal to at least one of the first easy axis and the second easy axis.

3. The magnetoresistive device as claimed in claim 1, wherein each of the fixed magnetic layer structure and the free magnetic layer structure has perpendicular magnetic anisotropy.

4. The magnetoresistive device as claimed in claim 1, wherein each of the fixed magnetic layer structure and the free magnetic layer structure has in-plane magnetic anisotropy.

5. The magnetoresistive device as claimed in claim 1, wherein the non-magnetic spacer layer comprising a material that enables interlayer exchange coupling between the tilting magnetic layer structure and the compensating magnetic layer.

6. The magnetoresistive device as claimed in claim 1, further comprising a pinning magnetic layer structure configured to pin the fixed magnetization orientation of the fixed magnetic layer structure, wherein the pinning magnetic layer structure comprises a pinning magnetic layer and the compensating magnetic layer antiferromagnetically coupled to each other, and wherein the tilting magnetic layer structure is interlayer exchange coupled to the pinning magnetic layer structure such that the interlayer exchange biasing field tilts, at equilibrium, the fixed magnetization orientation of the fixed magnetic layer structure to be along the tilting axis.

7. The magnetoresistive device as claimed in claim 6, wherein the pinning magnetic layer structure is arranged in between the fixed magnetic layer structure and the tilting magnetic layer structure.

8. The magnetoresistive device as claimed in claim 6, wherein the pinning magnetic layer structure is arranged in contact with the fixed magnetic layer structure.

9. The magnetoresistive device as claimed in claim 1, further comprising an antiferromagnetic layer magnetically coupled to the tilting magnetic layer structure.

10. The magnetoresistive device as claimed in claim 9, wherein the antiferromagnetic layer is arranged in contact with the tilting magnetic layer structure.

11. The magnetoresistive device as claimed in claim 1, wherein the tilting magnetic layer structure comprises a synthetic antiferromagnetic structure having a first tilting magnetic layer and a second tilting magnetic layer antiferromagnetically coupled to each other via a non-magnetic spacer layer.

12. The magnetoresistive device as claimed in claim 11, further comprising an antiferromagnetic layer magnetically coupled to the synthetic antiferromagnetic structure of the tilting magnetic layer structure.

13. A method of forming a magnetoresistive device, the method comprising:
   forming a free magnetic layer structure having a variable magnetization orientation;
   forming a fixed magnetic layer structure having a fixed magnetization orientation;
   forming a compensating magnetic layer having a magnetization orientation aligned at least substantially antiparallel to the fixed magnetization orientation of the fixed magnetic layer structure; and
   forming a tilting magnetic layer structure to provide an interlayer exchange biasing field to tilt, at equilibrium, the fixed magnetization orientation relative to the variable magnetization orientation to be along a tilting axis that is at least substantially non-parallel to at least one of a first easy axis of the fixed magnetization orientation and a second easy axis of the variable magnetization orientation,
   wherein the tilting magnetic layer structure is interlayer exchange coupled to the compensating magnetic layer via a non-magnetic spacer layer therebetween such that the interlayer exchange biasing field tilts, at equilibrium, the fixed magnetization orientation of the fixed magnetic layer structure to be along the tilting axis.

14. The method as claimed in claim 13, wherein the tilting magnetic layer structure has a magnetization orientation along an axis that is at least substantially orthogonal to at least one of the first easy axis and the second easy axis.

15. The method as claimed in claim 13, wherein the non-magnetic spacer layer comprising a material that enables interlayer exchange coupling between the tilting magnetic layer structure and the compensating magnetic layer.

16. The method as claimed in claim 13, further comprising forming a pinning magnetic layer structure configured to pin the fixed magnetization orientation of the fixed magnetic layer structure, wherein the pinning magnetic layer structure comprises a pinning magnetic layer and the compensating magnetic layer antiferromagnetically coupled to each other, and wherein the tilting magnetic layer structure is interlayer exchange coupled to the pinning magnetic layer structure such that the interlayer exchange biasing field tilts, at equilibrium, the fixed magnetization orientation of the fixed magnetic layer structure to be along the tilting axis.

17. The method as claimed in claim 16, wherein the pinning magnetic layer structure is arranged in between the fixed magnetic layer structure and the tilting magnetic layer structure.

18. The method as claimed in claim 16, wherein the pinning magnetic layer structure is arranged in contact with the fixed magnetic layer structure.

19. The method as claimed in claim 13, further comprising an antiferromagnetic layer magnetically coupled to the tilting magnetic layer structure.

20. The method as claimed in claim 13, wherein the tilting magnetic layer structure comprises a synthetic antiferromagnetic structure having a first tilting magnetic layer and a second tilting magnetic layer antiferromagnetically coupled to each other.

* * * * *